(12) United States Patent
Fujishima

(10) Patent No.: US 6,878,216 B2
(45) Date of Patent: Apr. 12, 2005

(54) SUBSTRATE PROCESSING METHOD AND SUBSTRATE PROCESSING SYSTEM

(75) Inventor: Sadayuki Fujishima, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/232,562

(22) Filed: Aug. 30, 2002

(65) Prior Publication Data

US 2003/0045104 A1 Mar. 6, 2003

(30) Foreign Application Priority Data

Sep. 3, 2001 (JP) ........................................ 2001-266215

(51) Int. Cl.$^7$ ................................................ B08B 3/00
(52) U.S. Cl. ............................ 134/34; 134/42; 134/26; 137/334
(58) Field of Search ............................. 134/18, 26, 34, 134/42; 137/334; 438/906; 210/542, 600

(56) References Cited

U.S. PATENT DOCUMENTS 6,589,338 B1 * 7/2003 Nakamori et al. ............ 118/50
6,663,721 B2 * 12/2003 Egashira et al. .............. 134/19
2001/0013555 A1 * 8/2001 Egashira et al. .............. 239/13
2003/0159716 A1 * 8/2003 Nagai et al. .................. 134/19

FOREIGN PATENT DOCUMENTS

| JP | 6-124934 | * 5/1994 |
| JP | 10-209125 | 8/1998 |
| JP | 2000283050 | * 10/2000 |
| JP | 2001-266215 | 9/2001 |

* cited by examiner

Primary Examiner—M. Kornakov
(74) Attorney, Agent, or Firm—Morrison & Foerster LLP

(57) ABSTRACT

The present invention controls a temperature of a processing liquid to be in within an allowable processing temperature range, whereby the processing efficiency and throughputs can be improved, deterioration of the processing liquid is prevented, and the life of the processing liquid can be extended.

In the liquid processing method, a chemical liquid L stored in a tank 10 can have temperatures controlled by heating and cooling by a heater 1 and cooling means 2 and is circulated for stand-by. the chemical liquid L in the stand-by circulation is supplied to wafers loaded in a processing chamber 6 to process the wafers, a cooling medium of the cooling means 2 is heat-exchanged with the chemical liquid L in the tank 10 to be ready for the next stand-by circulation.

14 Claims, 14 Drawing Sheets

SUBSTRATE PROCESSING METHOD AND SUBSTRATE PROCESSING SYSTEM

CROSS REFERENCE TO RELATED APPLICATIONS

The present application is related to subject matter disclosed in Japanese Patent Application No. 2001-266215 filed on Sep. 3, 2001 to which the subject application claims priority under Paris Convention and which is incorporated herein by reference.

BACKGROUND OF THE INVENTION

1. Field of the Invention

The present invention relates to a liquid processing method and a liquid processing system, more specifically a liquid processing method and a liquid processing system for supplying a processing liquid, e.g., a chemical liquid to objects to be processed, e.g., semiconductor wafers, LCD glass substrates, etc.

2. Related Background Art

In fabrication processes for semiconductor devices and fabrication processes for LCDs, generally liquid processing methods (systems) using processing liquids, etc. are widely used so as to remove resists adhering to processed objects, such as semiconductor wafers, LCD glasses, etc., and residues (polymers, etc.) remaining after drying processing.

As a liquid processing method (system) of such conventional liquid processing methods (systems) is known a cleaning processing method in which processing liquids to be used in the cleaning processing are used in recycled liquids for the efficient use of the processing liquids of expensive chemical liquids.

The liquid processing system using such recycled liquid mainly comprises, as shown in FIG. 13, a heater 1 which is heating means for heating a processing liquid L stored in a tank 10 to a prescribed temperature; cooling means 2 which passes a cooling medium, e.g., cooling water, for cooling the processing liquid L when the processing liquid in the tank 10 exceeds a set temperature; a stand-by circulation line 5 having a stand-by circulation passage 4 which circulates the processing liquid L in the tank 10 outside the tank 10 for stand-by; a nozzle 7 which is processing liquid supply means for supplying the processing liquid to objects-to-be-processed, e.g., wafers W, in a processing chamber 6; a supply passage 8a which supplies the processing liquid to the nozzle 7; a wafer processing unit 9 having a discharge passage 8b; a first change-over valve V1 and a second change-over valve V2 as change-over means for communicating and discommunicating the stand-by circulation passage 4 of the stand-by circulation line 5 with the supply passage 8a and the discharge passage 8b of the processing unit 9; and a flow meter FM inserted in the cooling water passage 2a of the cooling means 2 on the side of the cooling water supply source 2A.

In such liquid processing system, detected signals are supplied to control means, e.g., a central processing unit 30 (hereinafter called a CPU 30) from a liquid temperature sensor S for detecting a temperature of the processing liquid L in the tank 10 and from a temperature sensor T for detecting a temperature of the heater 1, and the heater 1 is controlled (PID control: proportional operation, integral operation and differential operation control) to be at a prescribed temperature by a PID temperature controller R which is based on control signals from the CPU 30, so that the processing liquid L is set at an allowable processing temperature, e.g., in a monitor temperature range of, e.g., 70±1° C. A pump P is inserted in the stand-by circulation passage 4, and a filter F is inserted in the stand-by circulation passage 4 on the discharge side (a secondary side) of the pump P.

The liquid processing system having the above-described structure has two piping routes, i.e., the stand-by circulation line for the processing liquid L and the wafer processing circulation line. The first and the second change-over valves V1, V2 are controlled to change over each other to thereby change over the piping routes. However, in such conventional liquid processing system (method), because of different radiation amounts (temperature exchange rates) between the circulation line and the wafer processing circulation line, the PID control cannot follow the heater heating or the radiation of the system, and a state where a temperature of the processing liquid is away from a desired temperature takes place. That is, when the first change-over valve V1 and the second change-over valve are changed over with each other to communicate the stand-by circulation passage 4 with the supply passage 8a and with the discharge passage 8b, as shown in FIG. 14 the temperature of the processing liquid becomes lower by about 2° C. than the allowable temperature (monitor temperature range). This is because when the processing liquid of high temperature is fed into the processing chamber 6, and wafers W which are substantially the same as the atmospheric temperature (around 25° C.), the processing liquid is considerably deprived of the heat and returns into the tank. The processing liquid having deprived of the heat lowers the temperature of the processing liquid L in the tank 10. It takes about 2 minutes and 30 seconds for the lowered temperature to reach the allowable temperature. During this period of time, a problem that the processing becomes insufficient, e.g., a problem that the ability of removing polymers is lowered takes place. Resultantly, the processing efficiency and throughputs are lowered. When the processing has been completed, the first change-over valve V1 and the second change-over valve V2 are changed over with each other to communicate the supply passage 8a and the discharge passage 8b with the stand-by circulation passage 4, a phenomena that the temperature of the processing liquid is higher by about 2° C. than the allowable temperature thereof (monitor temperature range) takes place. This is because a processing state of the processing liquid where the processing liquid has a large radiation abruptly changes to the stand-by state where the processing liquid has a small radiation. It takes about 12 minutes for the processing liquid to reach the allowable temperature, and during this period of time, the next processing cannot be made, with a resultant problem of throughput decrease. The temperature rise of the processing liquid L exceeding the allowable processing temperature range causes the problems of not only deterioration of the processing liquid L but also decrease of the life of the processing liquid L.

SUMMARY OF THE INVENTION

In view of the above-described circumstances, the present invention was made, and the present invention provides a liquid processing method and a liquid processing system which control a temperature of a processing liquid in the stand-by circulation before or after the processing, and a temperature of the processing liquid in the processing are controlled to be in an allowable processing temperature range, whereby improvement of the processing efficiency and improvement of throughputs can be attained, and the prevention of deterioration of the processing liquid and increase of the life of the processing liquid can be attained.

To attain the above-described object, in the liquid processing method according to the present invention, in which a processing liquid stored in a tank is heated and cooled by heaters and cooling means and is circulated for stand-by, the processing liquid in the stand-by circulation is fed to objects-to-be-processed loaded in a processing chamber to process the objects-to-be-processed, and the processing liquid fed to the objects-to-be-processed is returned into the tank, the processing liquid is concurrently heated and cooled in the stand-by circulation.

According to the present invention, the processing liquid in the tank can be concurrently heated and cooled, whereby the abrupt temperature increase of a temperature of the processing in the stand-by circulation, which exceeds a monitor temperature range can be suppressed, and the processing liquid can stand by for the next processing with the temperature controlled to be in an allowable processing liquid temperature range. Accordingly, the improvement of the processing efficiency and throughputs can be attained. The temperature rise of the processing liquid can be suppressed, whereby the deterioration of the processing liquid can be prevented, and the life of the processing liquid can be extended.

In the liquid processing method according to the present invention, in the stand-by circulation after the completion of the processing, the processing liquid in the tank is concurrently heated and cooled to control the processing liquid to be at a processing temperature.

According to the present invention, the processing liquid in the tank is concurrently heated and cooled in the stand-by circulation after the completion of the processing, whereby the abrupt change of the processing liquid from the processing state of a large radiation to the stand-by state of a small radiation can be suppressed. Accordingly, the abrupt temperature rise of a temperature of the processing liquid in the stand-by circulation, which exceeds a monitor temperature range can be suppressed, whereby the processing liquid can be ready for the next processing with the temperature controlled to be within the allowable processing temperature range. Accordingly, a stand-by period of time of the processing liquid and a processing interval can be shortened, and throughputs can be improved. The temperature rise of the processing liquid can be suppressed, which prevents the deterioration of the processing liquid and extends a life of the processing liquid.

In the liquid processing method according to the present invention, in the stand-by circulation before the start of the processing, the processing liquid in the tank is concurrently heated and cooled to control the processing liquid to be at a processing temperature, and in the processing, with the cooling by the cooling means stopped, the processing liquid is heated by heaters and is controlled to be at the processing temperature by the heating of the heaters. In the liquid processing method according to the present invention, the cooling is stopped simultaneously with the change-over from the stand-by circulation to the processing start. In the liquid processing method according to the present invention, the cooling is started simultaneously with the change-over to the stand-by circulation after the completion of the processing.

According to the present invention, the processing liquid in the tank is simultaneously heated and cooled in the stand-by circulation before the start of the processing, and the heating amount of the processing liquid is larger than a heating amount for controlling the temperature of the processing liquid to be a processing temperature when the cooling is not performed, whereby the temperature drop of the processing liquid having the heat deprived of can be suppressed. In the processing, with the cooling by the cooling means stopped, the processing liquid is heated by the heaters so as to control the temperature of the processing liquid to be within an allowable processing temperature. Accordingly, the processing efficiency can be improved, and throughputs can be improved.

In the liquid processing method according to the present invention, in the stand-by circulation before the start of the processing, the cooling is performed so that a heat amount discharged from the processing liquid by the cooling in the stand-by circulation is substantially equal to a heat amount discharged from the processing liquid in the processing.

In the liquid processing method according to the present invention, in the stand-by circulation after the completion of said processing, the cooling is performed so that a heat amount discharged from the processing liquid by the cooling in the stand-by circulation is substantially equal to a heat amount discharged from the processing liquid in the processing.

According to the present invention, in the stand-by circulation before the start of the processing or after the completion of the processing, the cooling is performed so that a heat amount discharged from the processing liquid by the cooling in the stand-by processing is substantially equal to a heat amount discharged from the processing liquid in the processing, whereby the abrupt temperature rise of a temperature of the processing liquid, which exceeds a monitor temperature range can be suppressed, and the processing liquid has the temperature of the processing liquid controlled to be within an allowable processing temperature range to be ready for the next processing. Accordingly, the stand-by period of time of the processing liquid and the processing interval can be shortened, and throughputs can be improved. The temperature rise of the processing liquid can be suppressed, which prevents the deterioration of the processing liquid and extends a life of the processing liquid.

In the liquid processing method according to the present invention, in the stand-by circulation before the start of said processing, the processing liquid in the tank is concurrently heated and cooled to control the processing liquid to be at a processing temperature, and in the processing, with the cooling by the cooling means stopped, the processing liquid is controlled to be at the processing temperature; and in the stand-by circulation after the completion of the processing, the processing liquid in the tank is concurrently heated and cooled to control the processing liquid to be at a processing temperature. In the liquid processing method according to the present invention, the cooling is stopped simultaneously with the change-over from the stand-by circulation to the processing start. In the liquid processing method according to the present invention, the cooling is started simultaneously with the change-over to the stand-by circulation after the completion of the processing.

According to the present invention, the processing liquid in the tank is concurrently heated and cooled in the stand-by circulation before the start of the processing, and a heating amount of the processing liquid is larger than a heating amount for controlling a temperature of the processing liquid to be the processing temperature without the cooling, whereby the temperature drop of the processing liquid having the heat deprived of can be suppressed. In the processing, with the cooling by the cooling means stopped, the processing liquid is heated by the heaters so as to control the temperature of the processing liquid to be within an allowable processing temperature. Accordingly, the processing efficiency can be improved, and throughputs can be improved.

In the liquid processing method according to the present invention, in the stand-by circulation before the start of the processing or after the completion of the processing, the cooling is performed so that a heat amount discharged from the processing liquid by the cooling in the stand-by circulation is substantially equal to a heat amount discharged from the processing liquid in the processing.

According to the present invention, in the stand-by circulation before the start of the processing or after the completion of the processing, the cooling is performed so that a heat amount discharged from the processing liquid by the cooling in the stand-by processing is substantially equal to a heat amount discharged from the processing liquid in the processing, whereby the abrupt temperature rise of a temperature of the processing liquid which exceeds a monitor temperature range can be suppressed, and the processing liquid has the temperature of the processing liquid controlled to be within an allowable processing temperature range to be ready for the next processing. Accordingly, the stand-by period of time of the processing liquid and the processing interval can be shortened, and throughputs can be improved. The temperature rise of the processing liquid can be suppressed, which prevents the deterioration of the processing liquid and extends a life of the processing liquid.

In the liquid processing method according to the present invention, in the stand-by circulation before the start of the processing, the processing liquid in the tank is concurrently heated and cooled, and immediately before the processing is started, a heating amount and a cooling amount of the heaters and of the cooling means are increased. When the heating amount and the cooling amount of the heaters and of the cooling means are increased immediately before the processing is started, the cooling can be performed so that the heat amount discharged from the processing liquid by the cooling is substantially equal to a heat amount discharged from the processing liquid when the processing is started. The cooling can be stopped simultaneously with the change-over from the stand-by circulation to the processing start. And, the cooling can be started simultaneously with the change-over from the processing completion to the stand-by circulation.

According to the present invention, immediately before the start of the processing, a heating amount and a cooling amount of the heaters and of the cooling means are increased, whereby the heat is prevented from being abruptly deprived of at the start of the processing, which allows the processing efficiency to be improved and throughputs to be improved.

Additionally, at the start of the processing, the cooling by the cooling means is stopped, and the processing liquid is controlled by the heating of the heaters to be at a processing temperature, whereby a temperature of the processing liquid to be used in the processing can be controlled to be in an allowable processing temperature range. Accordingly, the processing efficiency can be improved, and throughputs can be improved.

The liquid processing system according to the present invention comprises heaters for heating a processing liquid stored in a tank; cooling means for flowing a cooling medium for cooling the processing liquid in the tank; a stand-by circulation line for circulating the processing liquid in the tank outside the tank for stand-by;

processing liquid supply means for supplying the processing liquid to objects-to-be-processed loaded in a processing chamber; a supply passage for supplying the processing liquid to the processing liquid supply means; a discharge passage for discharging the processing liquid used for processing from the processing chamber; a processing circulation line including the supply passage, supply means and the discharge passage; change-over means for changing over a flow of the processing liquid between the stand-by circulation line and the processing circulation line; opening/closing means inserted in a communication passage for the cooling medium; and control means for controlling the heaters to heat the processing liquid when the processing liquid is switched to the stand-by circulation line by the change-over means while controlling the opening/closing means to open to pass the cooling medium into the tank.

In the liquid processing system according to the present invention, the control means can control the heaters to heat the processing liquid while can control the opening/closing means to open to pass the cooling medium into the tank, simultaneously with the change-over of the flow of the processing liquid from the processing circulation line to the stand-by circulation line by the change-over means.

In the liquid processing system according to the present invention, the control means can control the opening/closing means to close to stop the flow of the cooling medium into the tank simultaneously with switching the flow of the processing liquid from the stand-by circulation line to the processing circulation line by the change-over means.

In the liquid processing system according to the present invention, the opening/closing means is a flow rate control valve of variable flow rate; the control means can control the heaters to heat the processing liquid while can control the flow rate control valve to permit a small amount of the cooling medium to flow into the tank, simultaneously with the change-over of the flow of the processing liquid from the processing circulation line to the stand-by circulation line; the control means can control the flow rate control valve to permit a large amount of the cooling medium to flow into the tank before the change-over of the flow of the processing liquid from the stand-by circulation line to the processing circulation line, and control the opening/closing means to close to stop the flow of the cooling medium into the tank simultaneously with the change-over of the flow of the processing liquid from the stand-by circulation line to the processing circulation line.

In the liquid processing system according to the present invention, the opening/closing means comprises a first opening/closing valve and a second opening/closing valve which are inserted in parallel in the flow passage of the cooling medium; and the control means can control the heaters to heat the processing liquid and control the first opening/closing valve to open to pass the cooling medium into the tank, simultaneously with the change-over of the flow of the processing liquid from the processing circulation line to the stand-by circulation line; the control means can control the first and the second opening/closing valves to open to pass the cooling medium into the tank before the change-over of the processing liquid from the stand-by circulation line to the processing circulation line, and control the opening/closing means to close to stop the flow of the cooling medium into the tank simultaneously with the change-over of the flow of the processing liquid from the stand-by circulation line to the processing circulation line.

The present invention includes the stand-by circulation line, the processing circulation line and the change-over means for the change-over between the lines. The present invention includes the heaters and the cooling means. The processing liquid in the tank can be heated and cooled when the processing liquid is circulated to the stand-by circulation line for stand-by. Thus, the abrupt increase of a temperature of the processing liquid in the stand-by circulation, which exceeds a monitor temperature range can be suppressed, and the processing liquid can be ready for the next processing with the temperature controlled to be in the allowable processing temperature range. Accordingly, the processing efficiency can be improved, and throughputs can be improved. The temperature rise of the processing liquid can be suppressed, whereby deterioration of the processing liquid can be prevented, and a life of the processing liquid can be extended.

The prevent invention comprises the opening/closing means in the form of the flow rate control valve of variable flow rate or in the form of the opening/closing valves disposed in parallel. A flow rate of the cooling medium is controlled, whereby the abrupt change of a temperature of the processing liquid from the processing state of a large radiation to the stand-by state of a small radiation, which exceeds the monitor temperature range can be suppressed. Accordingly, the stand-by circulation is shortened, and throughputs can be improved, whereby the deterioration of the processing liquid can be prevented, and the life of the processing liquid can be extended.

DESCRIPTION OF THE PREFERRED EMBODIMENTS

Embodiments of the present invention will be explained with reference to the drawings. In the embodiments, the liquid processing system according to the present invention is applied to cleaning/drying systems for semiconductor wafers. The same members of the liquid processing system according to the embodiments as those of the conventional liquid processing system will be represented by the same reference numbers.

A. A First Embodiment

Figure 1:
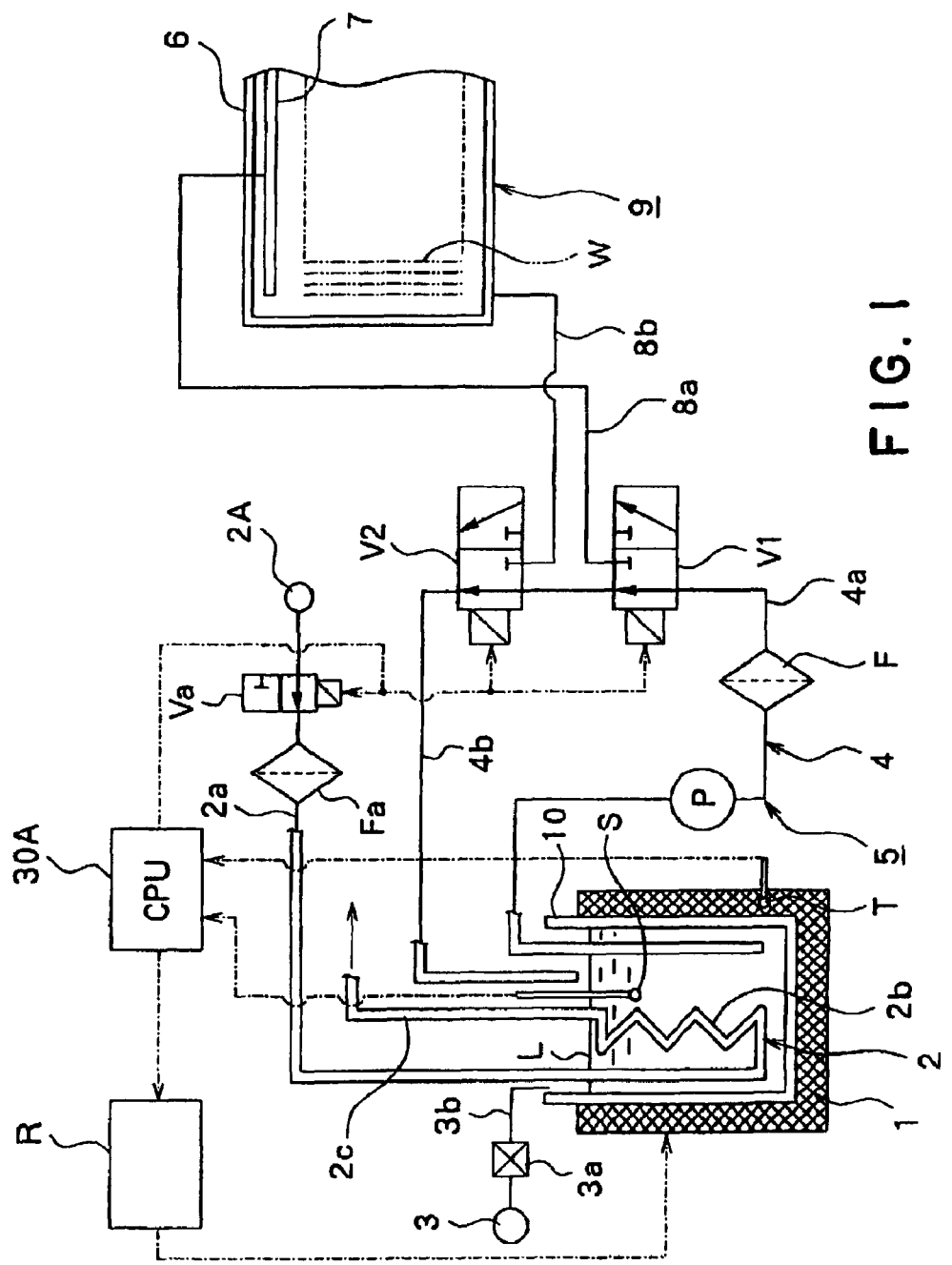
FIG. 1 is a block diagram of a first embodiment of the liquid processing system according to the present invention.

FIG. 1 is a block diagram of the liquid processing system according to a first embodiment of the present invention. In the first embodiment, the temperature rise of a processing liquid after the completion of processing is suppressed to retain a temperature of the processing liquid in an allowable temperature range (monitor temperature range), whereby a period of time of the stand-by circulation is shortened, and throughputs can be improved.

The liquid processing system according to the first embodiment mainly comprises a tank 10 for storing a chemical liquid L as a processing liquid; a heater 1 as heating means for heating the chemical liquid L stored in the tank 10 to a prescribed temperature; cooling means 2 for flowing a cooling medium, e.g., cooling water for cooling the chemical liquid L in the tank 10; a stand-by circulation line 5 having a stand-by circulation passage 4 for circulating the processing liquid in the tank 10 outside the tank for stand-by; a nozzle 7 as processing liquid supply means for supplying the processing liquid to objects to be processed, e.g., wafers W loaded in a processing chamber 6; a supply passage 8a for supplying the processing liquid to the nozzle 7; a wafer processing unit 9 including a discharge passage 8b for discharging the processing liquid supplied for the processing from the processing chamber 6; a first change-over valve V1, and a second change-over valve V2 as means for communicating and discommunicating the stand-by circulation passage 4 of the stand-by circulation line 5 with the supply passage 8a and the discharge passage 8b of the processing unit 9; an opening/closing valve Va as opening/closing means inserted in a cooling water passage 2a of the cooling means 2 on the side of a cooling water supply source 2A; and control means, e.g., a central processing unit 30A (hereinafter called a CPU 30A) for controlling the change-over and the opening/closing of the first ad the second change-over valves V1, V2 and the opening/closing valve Va and controlling the temperature of the heater 1. A pipe 4a from the tank 10 to the first change-over valve V1, the supply passage 8a, the wafer processing unit 9, the discharge passage 8b, and a pipe 4b from the second change-over valve V2 to the tank 10 constitute a processing circulation line.

The cooling means has a cooling portion 2b in the shape of, e.g., a coil disposed inside the tank connected to one end of the supply-side cooling water passage 2a having the other end connected to the supply source 2A of cooling water as a cooling medium for the cooling temperature control. The cooling portion 2b of the cooling means 2 is connected to a flow passage 2c on the discharge side, which is opened in a drain (not shown) of the tank to the outside. A filter Fa is inserted in the supply-side cooling water passage 2a on the discharge side (secondary side) of the opening/closing valve Va. The cooling portion 2b of the cooling means 2 is here disposed inside the tank 10 but may be disposed outside the tank 10.

The stand-by circulation passage 4 constituting the stand-by circulation line 5 is formed of a pipe of fluoroplastics, e.g., PFA or others, having one end as the suction side disposed near the bottom of the tank 10 and the other end as the discharge side disposed above the tank 10. The pump P, the filter F, the first change-over valve V1 and the second change-over valve V2 are, inserted in the stand-by circulation passage 4 in the stated order sequentially from the suction side. The first change-over valve V1 comprises a 3-port 2-seat change-over valve which communicates and discommunicates the stand-by circulation passage 4 with the supply passage 8a of the wafer processing unit 9. The second change-over valve V2 comprises a 3-port 2-seat change-over valve which communicates and discommunicates the stand-by passage 4 with the discharge passage of the wafer processing unit 9. The change-over means here comprises the first and the second change-over valves V1, V2, but the first and the second change-over valves V1, V2 are not essential. The change-over means may comprise, for example, a three-way valve which selectively change over the stand-by circulation passage to the supply passage 8a and to the discharge passage 8b.

The CPU 30A receives detected signals from a liquid temperature sensor S which detects a temperature of the chemical liquid L in the tank 10 and from a temperature sensor T which detects a temperature of the heater 1 and supplies a control signal based on the detected signals and data stored in advance, to the PID temperature controller R so as to control (PID control) the heater to have a prescribed allowable temperature, in a monitor temperature range of, e.g., 70±1° C. The CPU 30A, based on data programmed in advance, controls timings of the change-over operations and the opening/closing operations, etc. of the first and the second change-over valves V1, V2 and the opening/closing valve Va, i.e., changes over the first and the second change-over valves V1, V2 to switch the stand-by circulation line to the processing circulation line, simultaneously therewith closing the opening/closing valve Va to stop cooling the chemical liquid L, or switches the processing circulation line to the stand-by circulation line, simultaneously therewith opening the opening/closing valve Va to start cooling the chemical liquid.

The tank 10 is connected to a chemical liquid supply source 3 as a processing liquid supply source through a chemical liquid pipe 3b with a chemical liquid opening/closing valve 3a inserted in, so that when the chemical liquid in the tank 10 is short, the chemical liquid L is supplemented by the chemical liquid supply source 3.

Figure 2:
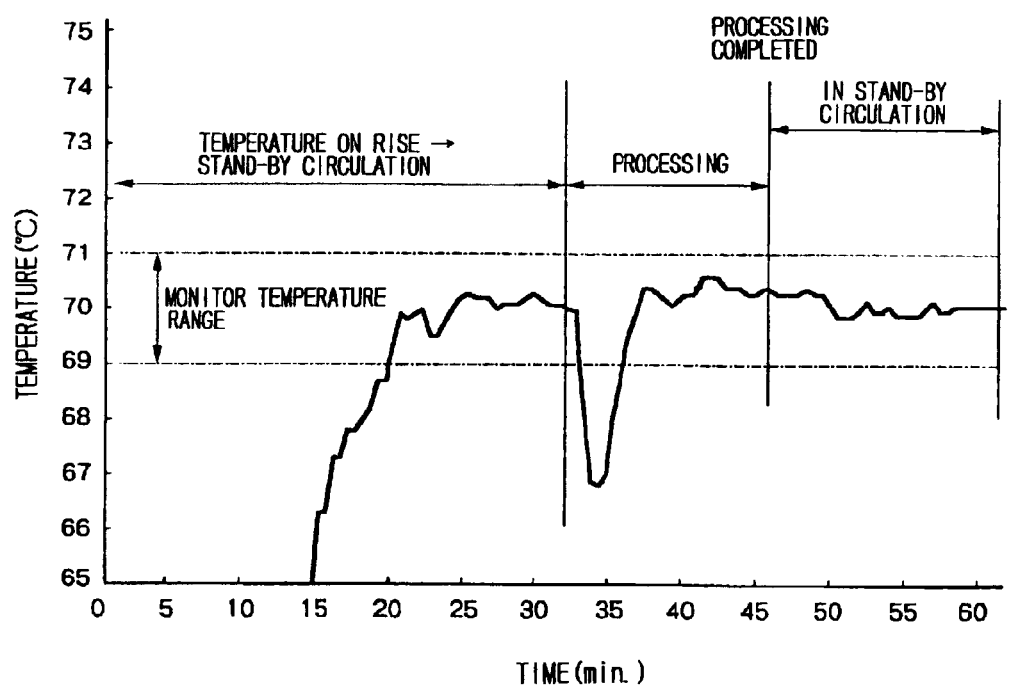
FIG. 2 is a graph of relationships between temperatures and time before the processing, in the processing and in the stand-by circulation of the first embodiment of the liquid processing system.

Then, an operational mode of the liquid processing system having the above-described constitution will be explained with reference to the graph shown in FIG. 2.

At the time of actuating the liquid processing system, the heater 1 is operated while the pump P is operated, so as to raise a temperature of the chemical liquid L in the tank 10 to a processing temperature (monitor temperature range) while the chemical liquid L is circulated for stand-by in the stand-by circulation passage 4 (stand-by circulation).

Next, the first change-over valve V1 is changed over to communicate the stand-by circulation passage 4 (the pie 4a) with the supply passage 8a while the second change-over valve V2 is changed over to communicate the stand-by circulation passage 4 (the pipe 4) with the discharge passage 8b. The processing is started while the chemical liquid L is circulated (processing circulation). During this processing, the chemical liquid L is temperature-controlled to a prescribed processing temperature by the heater 1 and is showered (fed) from the nozzle 7 to a plurality, e.g., 50 sheets, of wafers vertically arranged in the processing chamber, and the cleaning processing for the wafers W is performed.

When the processing is completed, with the heating by the heater set on, the first change-over valve V1 is changed over to discommunicate the stand-by circulation pipe 4 (the pipe 4a) with the supply passage 8a while the second change-over valve V2 is changed over to discommunicate the stand-by circulation passage 4 (the pipe 4b) with the discharge passage 8b so as to change over the processing circulation line to the stand-by circulation line. Simultaneously therewith, the opening/closing valve Va is opened to pass the cooling water through the flow passage 2a and the cooling portion 2b of the cooling means 2. Thus, the chemical liquid L in the tank is heat-exchanged with the cooling water to be cooled, whereby the abrupt change of the chemical liquid L from the processing state of a large radiation to the stand-by state of a small radiation can be suppressed. At this time, the cooling is performed so that a radiation amount of the chemical liquid L in the processing circulation line, and a heat amount discharged from the chemical liquid by cooling in the stand-by circulation line are substantially equal to each other before and after the change-over from the processing circulation line to the stand-by circulation line.

Figure 14:
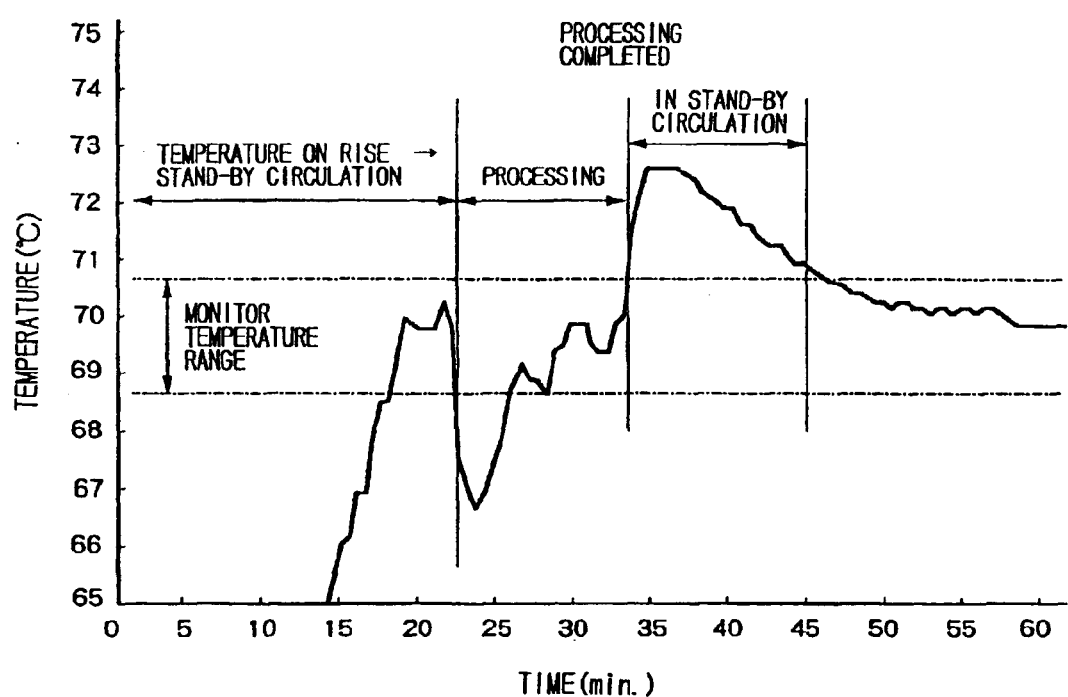
FIG. 14 is a graph of relationships between temperature and time of the conventional liquid processing system before the processing, in the processing and in the stand-by circulation.

Accordingly, the abrupt temperature rise (overshoot) exceeding a monitor temperature range immediately after the completion of the processing as in the conventional liquid processing system shown in FIG. 14 can be suppressed, whereby a temperature of the chemical liquid L is in the allowable processing temperature range (70±1° C.) and can be ready for the next stand-by circulation. Thus, a stand-by period of time of the chemical liquid L can be shortened, and an inter-processing interval can be shortened. Throughputs can be improved. The temperature rise of the chemical liquid L can be suppressed, which prevents the deterioration of the chemical liquid L and extends the life of the chemical liquid L.

B. A Second Embodiment

Figure 3:
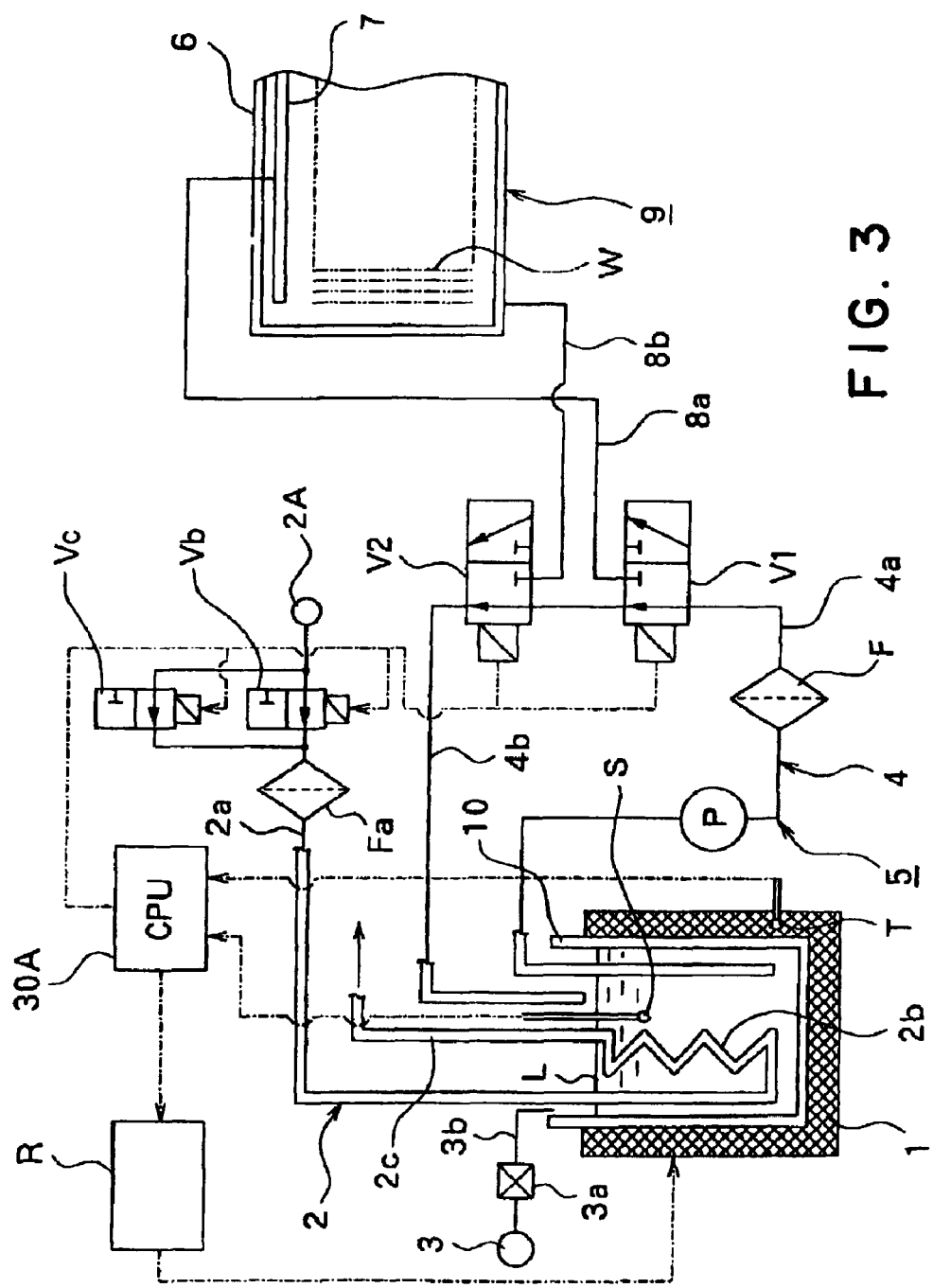
FIG. 3 is a block diagram of a second embodiment of the liquid processing system according to the present invention.

FIG. 3 is a block diagram of a second embodiment of the liquid processing system according to the present invention. In the second embodiment, a temperature of a processing liquid used in the processing and a temperature of a chemical liquid L before the processing are controlled to be in an allowable temperature (monitor temperature range) of the processing temperature, whereby the processing efficiency can be improved, and the stand-by circulation period of time can be shortened so as to improve throughputs.

That is, as shown in FIG. 3, the liquid processing system according to the second embodiment comprises a first and a second opening/closing valves Vb, Vc as first and second opening/closing means inserted in parallel in cooling water flow passage 2a in place of the opening valve Va in the first embodiment, and a CPU 30A controls the opening and closing control of the first and the second opening/closing valves Vb, Vc. The first opening/closing valve Vb comprises a smaller amount valve which permits a smaller amount of the cooling water to pass through, and the second opening/closing valve vc comprises a larger-amount valve which permits an amount of the cooling water which is about 4 to 6 times the amount the first opening/closing valve Vb permits.

The rest of the second embodiment is the same as the rest of the first embodiment, and the same members are represented by the same reference numbers not to repeat their explanation.

Figure 4:
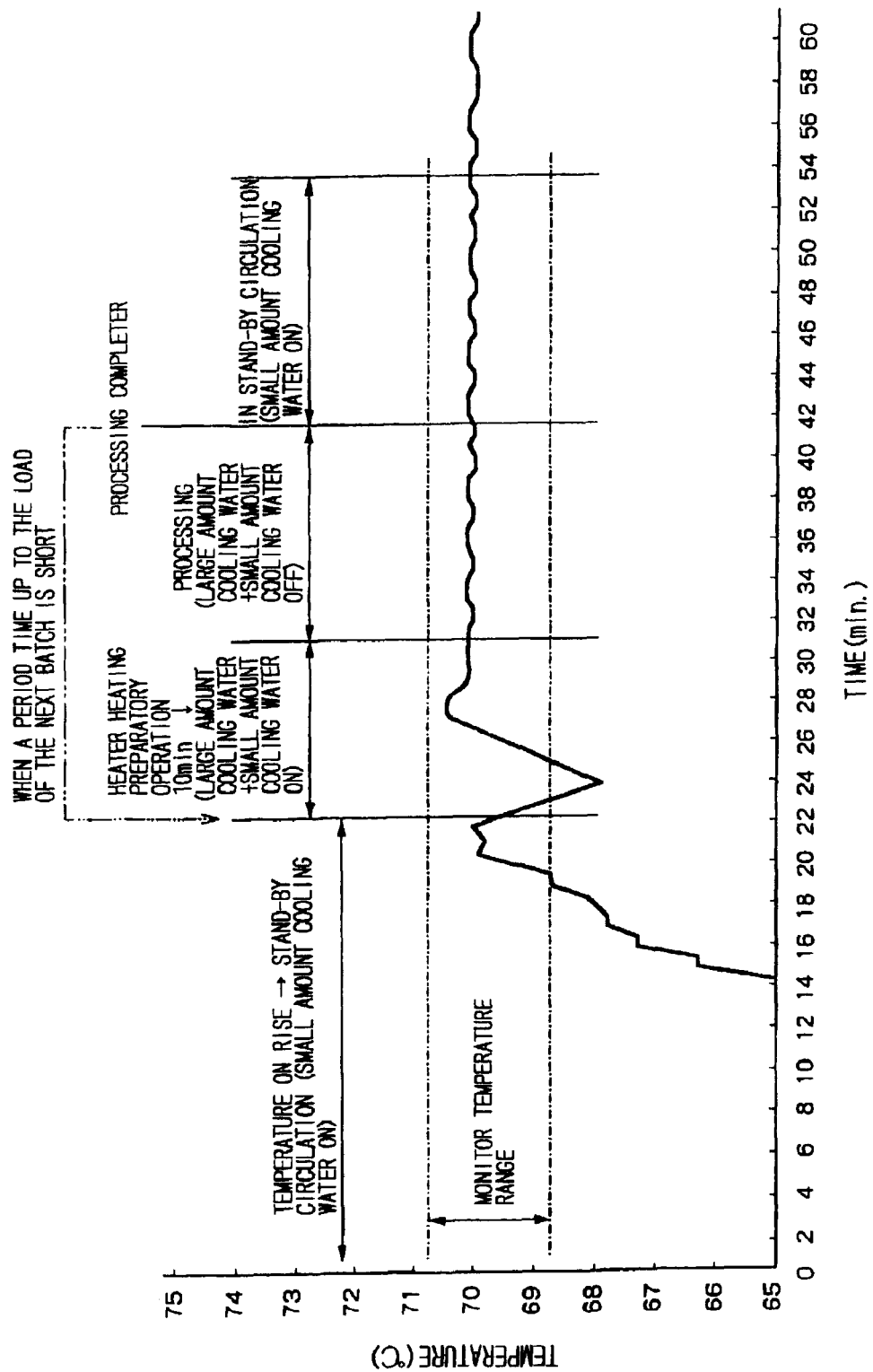
FIG. 4 is a graph of relationships between temperatures and time before the processing, in the processing and in the stand-by circulation of the second embodiment of the liquid processing system.

Then, an operational mode of the liquid processing system according to the second embodiment will be explained with reference to the graph shown in FIG. 4.

First, when the liquid processing system is actuated, the heater 1 is operated while the first opening/closing valve Vb is opened to supply a small amount of the cooling water to the cooling means. The pump P is operated to raise a temperature of the chemical liquid L in the tank 10 to a processing temperature (monitor temperature range), and the chemical liquid L is circulated for stand-by in the stand-by circulation passage 4 (temperature raise-stand-by circulation). With the chemical liquid L having the temperature thus raised to the allowable processing temperature (monitor temperature range), the second opening/closing valve Vc is opened so that the chemical liquid L in the tank 10 heat-exchanges with the cooling water. Then, the chemical liquid L in the tank 10 temporarily has a lower temperature than the allowable processing temperature (monitor temperature range). However, the CPU 30A supplies a control signal to the PID temperature controller R, based on a detected signal from the liquid temperature sensor S, and the PID temperature controller R controls the heater 1 to have a heat amount larger than a heat amount at the time when the cooling is not performed for controlling the chemical liquid L to the processing temperature. A temperature of the chemical liquid L is raised to the allowable processing temperature (monitor temperature range) (heater heating preparatory operation). The heater heating preparatory operation is performed 10 minutes before the next processing is started, which is a stand-by period of time for the next processing.

Next, the chemical liquid L in the stand-by circulation is supplied for the processing. At this time, the first and the second opening/closing valves Vb, Vc are closed to stop the supply of the cooling water. On the other hand, the first change-over valve V1 is changed over to communicate the stand-by circulation passage 4 (the pipe 4a) with the supply passage 8a while the second change-over valve V2 is changed over to communicate the stand-by circulation passage 4 (the pipe 4b) with the discharge passage 8b, so as to let the chemical liquid L flow through the processing circulation line. Thus, the supply of the cooling water is stopped, and the processing chamber 6 and the tank 10 are communicated with each other, whereby a heat amount which has been absorbed largely by the cooling water, i.e., radiated by the chemical liquid L is used as a heat amount to be absorbed by the wafer processing unit 9 which is the major radiator of the processing circulation line, whereby the conventional temperature decrease (undershoot) down to below the monitor temperature taking place immediately after the start of the processing as shown in FIG. 14 can be suppressed. In this processing, the chemical liquid L is showered (fed) from the nozzle 7 to a plurality, e.g., 50 sheets, of wafers W vertically arranged in the processing chamber 6, and the cleaning processing for the wafers F is performed.

When the processing is completed, with the heating by the heater 1 set on, the first change-over valve V1 is changed over to discommunicate the stand-by circulation passage 4 (the pipe 4a) with the supply passage 8a while the second change-over valve V2 is changed over to discommunicate the stand-by circulation passage 4 (the pipe 4b) with the discharge passage 8b, whereby the processing circulation line is changed over to the stand-by circulation line. Simultaneously therewith, the first opening/closing valve Vb is opened to pass a small amount of the cooling water through the cooling water passage 2a and the cooling portion 2b of the cooling means 2. Thus, the chemical liquid L in the tank 10 is heat-exchanged with the cooling water to be cooled, whereby the abrupt change of the chemical liquid L from the processing state having a large amount of radiation to the stand-by state having a small amount of radiation can be suppressed. At this time, the cooling is performed so that a heat amount radiated from the chemical liquid L by the cooling of the stand-by circulation line is substantially equal to a radiation amount of the chemical liquid L in the processing circulation line before and after the change-over from the stand-by circulation line to the processing circulation line. The cooling is performed so that before and after the change-over from the processing circulation line to the stand-by circulation line, a radiation amount of the chemical liquid L in the processing circulation line is substantially equal to a heat amount radiated from the chemical liquid L by the cooling in the stand-by circulation line.

Accordingly, by the use of the liquid processing system according to the second embodiment, the temperature of the chemical liquid L to be used in the processing can be in the allowable processing temperature range (monitor temperature range), whereby the processing efficiency can be improved. The chemical liquid L can be ready for the next stand-by circulation with the temperature in the allowable processing temperature range (70±1° C.), whereby a stand-by period of time and an inter-processing period of time can be shortened, and throughputs can be improved. The temperature rise of the chemical liquid L can be suppressed, whereby the deterioration of the chemical liquid L can be prevented, and the life of the chemical liquid L can be extended.

In the present embodiment, a flow rate of the first opening/closing valve Vb and that of the second opening/closing valve Vc are made different from each other, whereby before the start of the processing, because a large amount of heat is radiated from the chemical liquid L in the wafer processing unit 9, the first opening/closing valve Vb and the second opening/closing valve Vc are opened to pass a large amount of the cooling water, and after the processing is completed, because a radiation amount of the chemical liquid L is small, the first opening/closing valve Vb alone, whose flow rate is lower, is opened. However, it is not essential to differ flow rates of the first opening/closing valve Vb and the second opening/closing valve Vc from each other, and opening/closing valves having the same flow rate may be selectively opened and closed.

C. A Third Embodiment

Figure 5:
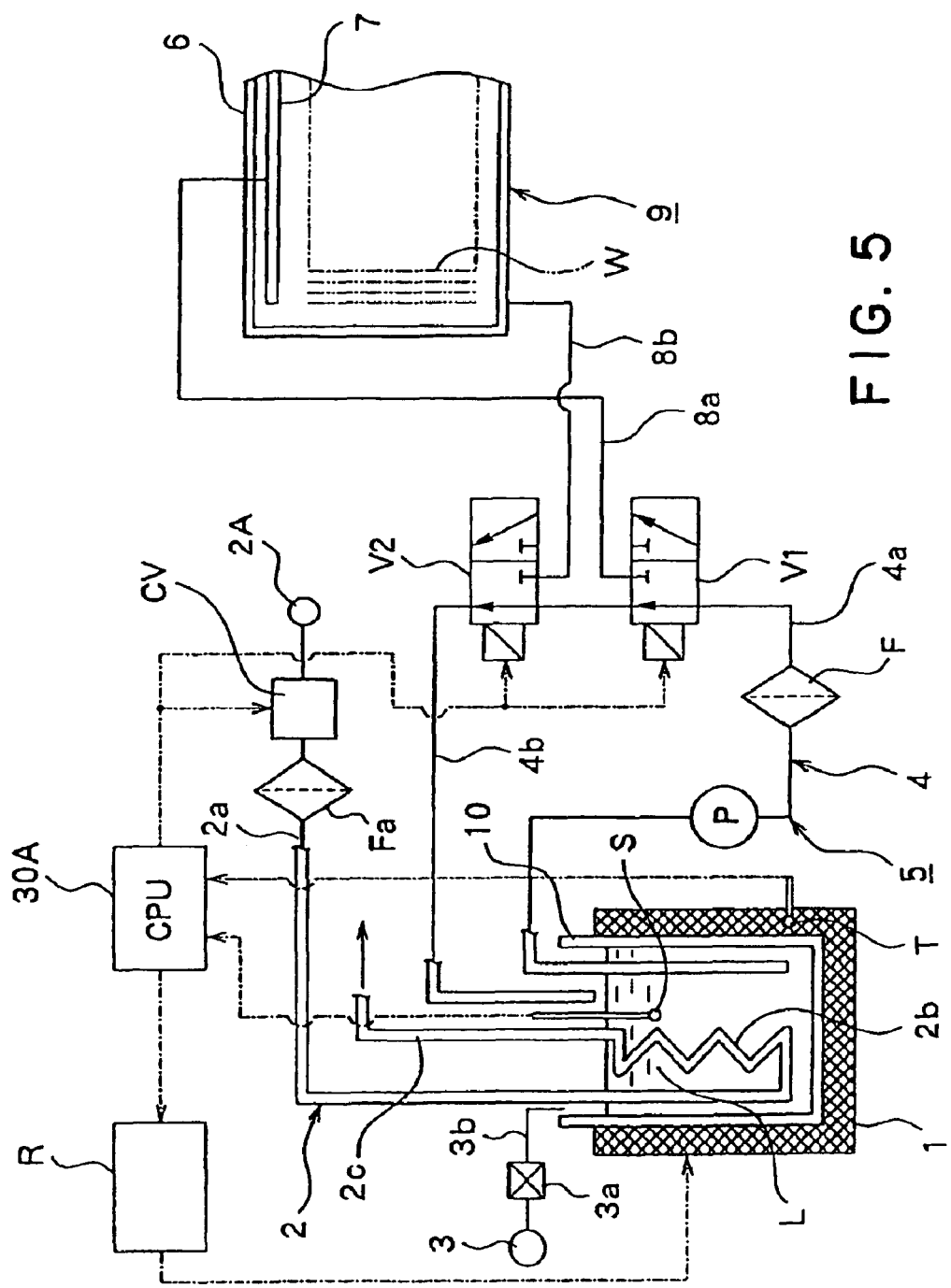
FIG. 5 is a block diagram of a third embodiment of the liquid processing system according to the present invention.

FIG. 5 is a block diagram of a third embodiment of the liquid processing system according to the present invention. In the third embodiment, as in the second embodiment, a temperature of a processing liquid used in the processing and a temperature of a chemical liquid L before the processing are controlled to be in an allowable processing temperature range (monitor temperature range), whereby throughputs are improved by improving the processing efficiency and shortening the stand-by circulation period of time.

As shown in FIG. 5, the liquid processing system according to the third embodiment comprises a flow rate control valve Cv as flow rate control means, which can control a flow rate and is inserted in a cooling water passage 2a in place of the first and the second opening/closing means of the second embodiment, and the flow rate of the flow rate control valve CV can be controlled by a CPU 30A.

The rest of the third embodiment is the same as the first and the second embodiments, and the same members are represented by the same reference numbers not to repeat their explanation.

Then, an operational mode of the liquid processing system according to the third embodiment will be explained.

When the liquid processing system is actuated, a heater 1 is operated while the passage of the flow rate control valve CV is restricted to supply a small amount of the cooling water to cooling means 2. A pump P is operated to raise a temperature the chemical liquid L in a tank 10 to the processing temperature (monitor temperature range) while the chemical liquid L is circulated for stand-by through a stand-by circulation passage 4 (temperature rise—stand-by circulation). Thus, with the chemical liquid L raised to the allowable processing temperature (monitor temperature range), the passage of the flow rate control valve CV is full opened to supply a large amount of the cooling water to the cooling means 2 for the heat-exchange of the chemical liquid L in the thank 10 with the cooling water. Then, the temperature of the chemical liquid L in the tank 10 is temporarily lowered than the allowable processing temperature (monitor temperature range). However, based on a detected signal from a liquid temperature sensor S, the CPU 30A supplies a control signal to a PID temperature controller, and the PID temperature controller R controls a heat amount of the heater 1 to be larger than a heat amount for the processing, so that the temperature of the chemical liquid L is raised to the allowable processing temperature (monitor temperature range) (heater heating preparatory operation). The heater heating preparatory operation is performed 10 minutes before the start of the processing, which is a stand-by period of time for the next batch.

Next, the chemical liquid in the stand-by circulation is supplied for the processing. At this time, the flow rate control valve CV is closed to stop the supply of the cooling water, and on the other hand, a first change-over valve V1 is changed over to communicate the stand-by circulation passage 4 (a pipe 4a) with a supply passage 8a while a second change-over valve V2 is changed over to communicate the stand-by circulation passage 4 (a pipe 4b) with a discharge passage 8b to pass the chemical liquid L to processing circulation line. In this processing, the chemical liquid L is showered (fed) from a nozzle 7 to a plurality, e.g., 50 sheets of wafers vertically arranged in a processing chamber 6, and the cleaning processing for the wafers is performed.

After the processing is completed, with the heating by the heater set on, the first change-over valve V1 is changed over to discommunicate the stand-by circulation passage 4 (the pipe 4a) with the supply passage 8a while the second change-over valve V2 is changed over to discommunicate the stand-by circulation passage 4 (the pipe 4b) with the discharge passage 8b to change over the processing circulation line to the stand-by circulation line. Simultaneously therewith, the passage of the flow rate control valve CV is restricted to pass a small amount of the cooling water to a flow passage 2a and a cooling portion 2b of cooling means 2, whereby the chemical liquid L in the tank 10 is heat-exchanged with the cooling water to be cooled so that the abrupt change from the processing state where the chemical liquid L radiates a large amount of heat to the stand-by state where the chemical liquid L radiates a small amount of heat can be suppressed.

Thus, in the liquid processing system according to the third embodiment, as in the liquid processing system according to the second embodiment, the temperature of the chemical liquid L to be used for the processing can be within the allowable processing temperature range (monitor temperature range), whereby the processing efficiency can be improved. The chemical liquid L can be ready for the next processing with the temperature controlled in the allowable temperature range (70±1° C.), whereby the stand-by period of time of the chemical liquid L and the inter-processing interval can be shortened, and throughputs can be improved. The temperature rise of the chemical liquid L can be suppressed, whereby the deterioration of the chemical liquid L can be prevented, and the life of the chemical liquid L can be extended.

The liquid processing system according to the first to the third embodiments can be used not only singly but also in combination with cleaning/drying processing systems which will be exemplified below.

Then, one example of the cleaning/drying processing systems will be explained with reference to FIG. 6 to 11.

Figure 6:
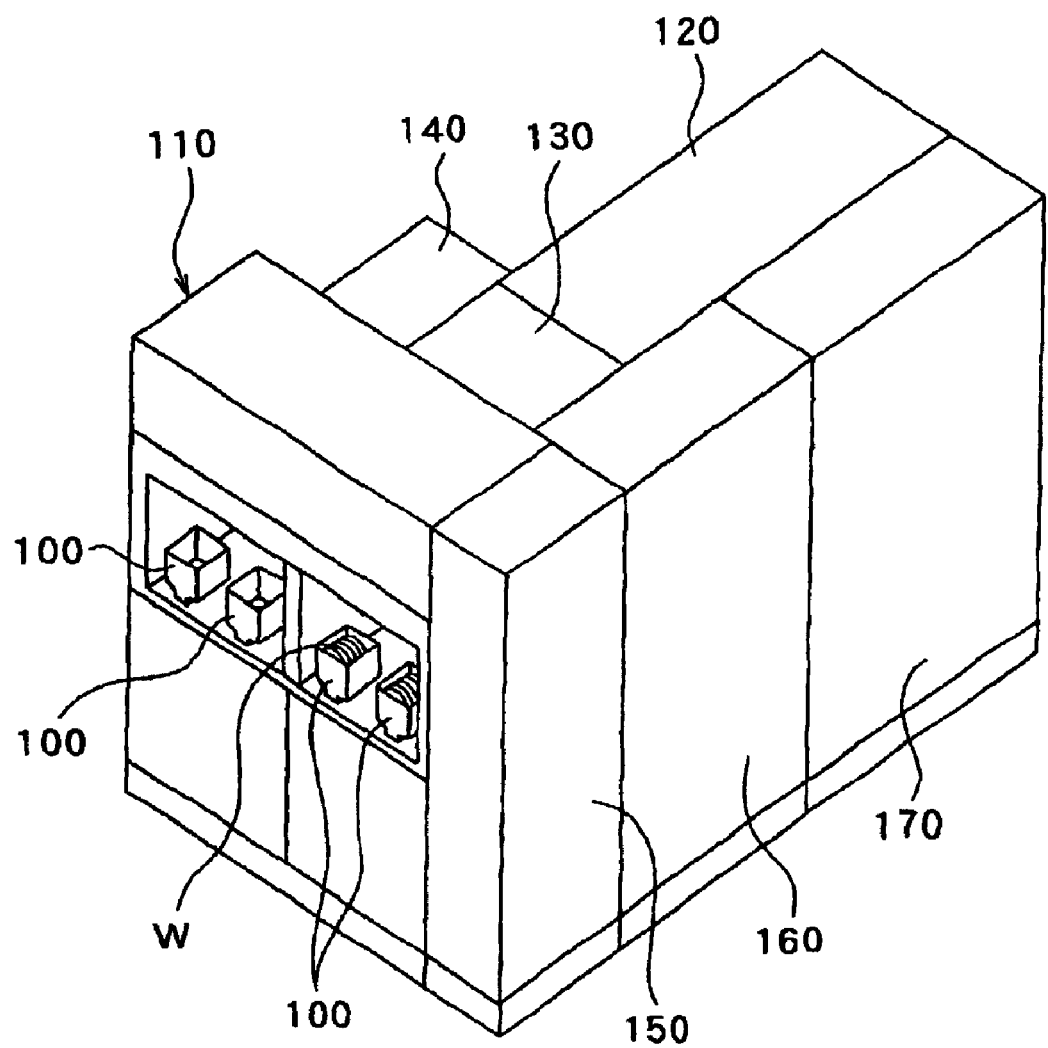
FIG. 6 is a perspective view of a cleaning/drying processing system with the liquid processing system according to the present invention incorporated.
Figure 7:
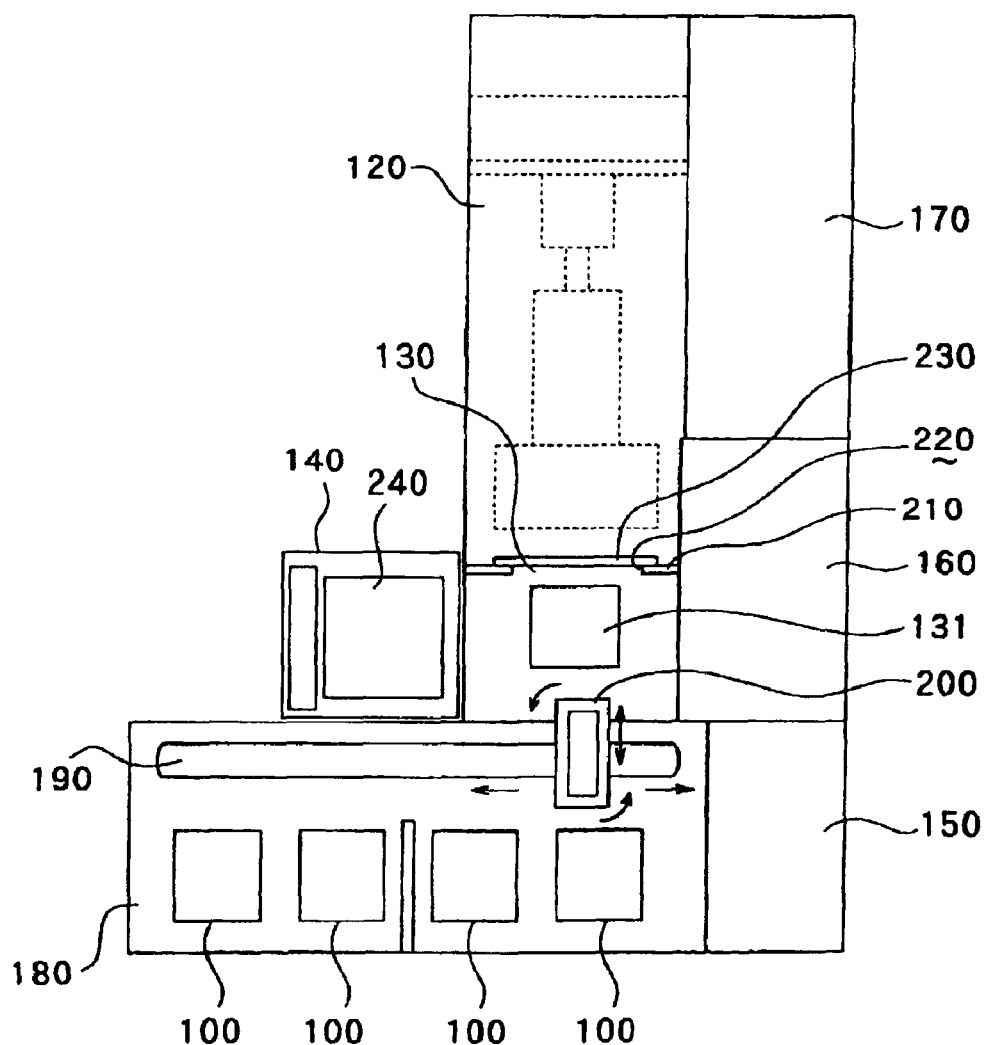
FIG. 7 is a diagrammatic plan view of the cleaning/drying processing system shown in FIG. 6.

As shown in FIGS. 6 and 7, the cleaning/drying processing system according to the example comprises a container loading/unloading unit 110 for loading/unloading containers, e.g., carriers 100 which can hold wafers W; a cleaning processing unit 120 incorporating the liquid processing unit according to the present invention for cleaning- and drying-processing the wafers W; a stage unit 130 which is disposed between the container loading/unloading unit 110 and the cleaning processing unit 120 and loads/unloads the carriers 100 into/out of the cleaning processing unit 120; a carrier cleaning unit 140 for cleaning the carriers 100; a carrier stock 120 for stocking a plurality of carriers 100; an electric power source unit 160 and a chemical tank box 170.

The carrier load/unload unit 110 comprises a mount 180 which can accommodate 4 carriers 100, and a carrier carrying mechanism 200 disposed displaceably along a carriage passage 190 formed in the direction of the arrangement of the carriers 100. The carrier carrying mechanism 200 carries the carriers 100 on the mount 180 to the stage unit 130, and carries the carriers 100 in the stage unit 130 to the mount 180. Each carrier 100 can hold, e.g., 25 sheets wafers W, and the wafers W are vertically arranged in the carrier 100.

The stage unit 130 comprises a stage 131 for the carriers 100 to be mounted on. The carriers 100 placed on the stage 131 from the container load/unload unit 110 are carried into the cleaning processing unit 120 by the carrier carrying mechanism 200 comprising a cylinder, and the carriers 100 in the cleaning processing unit 120 are carried out to the stage 131 by the carrier carrying mechanism 200.

A partition wall 210 is provided between the stage 130 and the cleaning processing unit 120. An opening for the carriers to be loaded/unloaded through is formed in the partition wall 210. The opening 220 is opened/closed by a shutter 230, and the shutter 230 is closed during the processing and opened when the carriers 100 are loaded/unloaded.

The carrier washing unit 140 includes a carrier washing tank 240 and cleans the carriers 100 out of which the wafers W have been unloaded in the cleaning processing unit 120 and are empty.

The carrier stock 150 temporarily accommodates the carriers 100 out of which wafers W to be cleaning processed have been unloaded and are empty, and accommodates for stand-by the empty, washed carriers for holding cleaned wafers W. The carrier stock 150 can vertically stock a plurality of the carriers 100, and includes a carrier moving mechanism which moves required ones of the carriers 100 in the carrier stock 150 onto the mount 180 and moves the carriers to required positions of the carrier stock 150.

Figure 8:
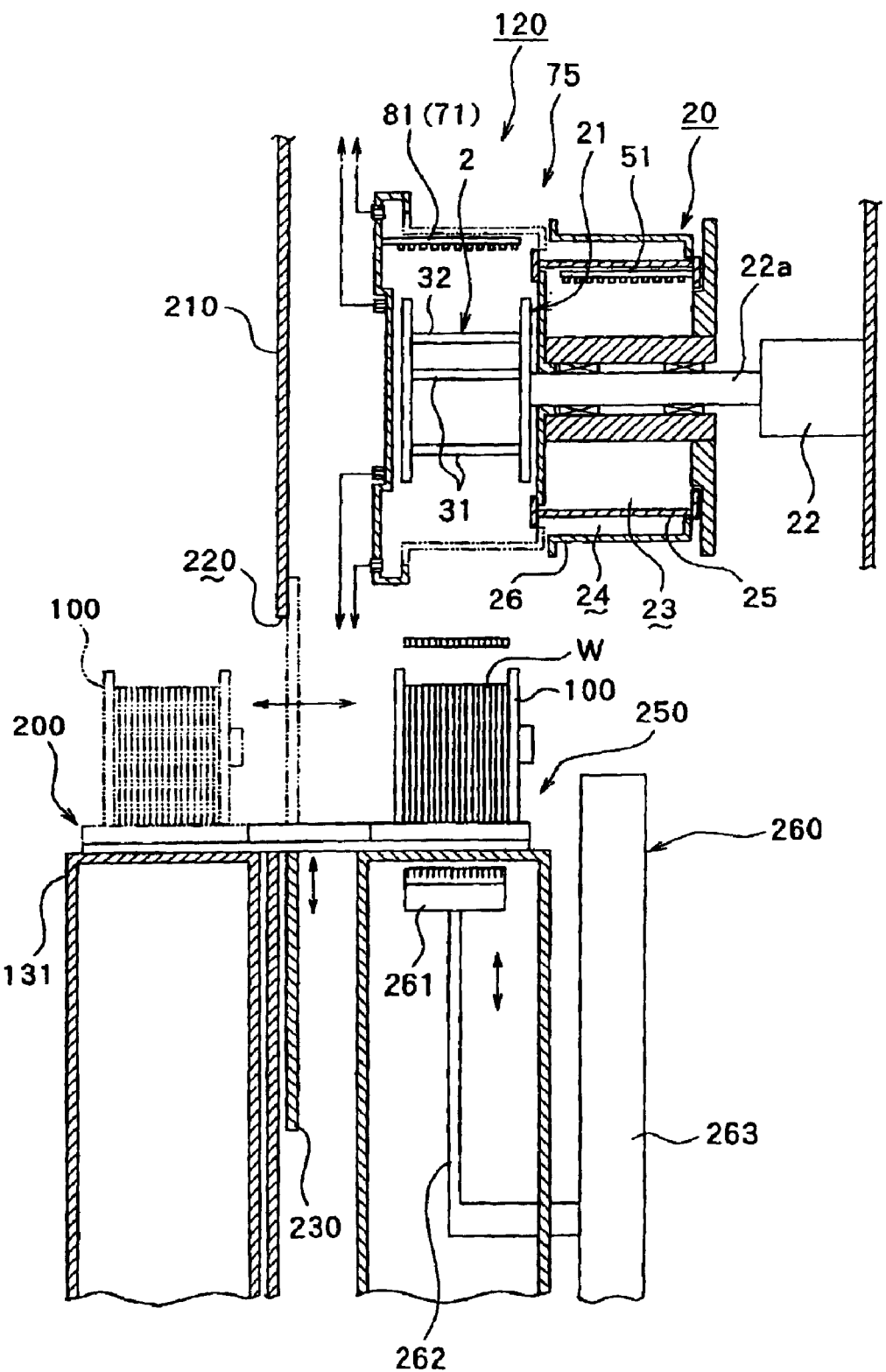
FIG. 8 is a diagrammatic sectional view of a double-chamber liquid processing system including the liquid processing system according to the present invention.

As shown in FIG. 8, the cleaning processing unit 120 comprises cleaning processing means 20 which corresponds to the above-described wafer processing unit, carrier stand-by means 250 for causing the carriers 100 to stand by right below the cleaning processing means 20; and a wafer moving mechanism 260 which pushes up a plurality of wafers W in the carrier 100 standing by in the carrier stand-by unit 250 to move to the cleaning processing means 20 and holding a plurality of wafers W in the cleaning processing means 20 to load the wafers W into the carrier 100 in the carrier stand-by unit 250. As shown in FIG. 8, the wafer moving mechanism 260 comprises wafer holding members 261 for holding wafers W, support members 262 for supporting the wafer holding members 261 which are arranged vertical, and a lift driving unit 263 for moving up and down the wafer holding members 261 via the support members 262.

The cleaning processing means 20 removes, after etching processing of the wafers W, resist masks, and polymer layers, etc. which are etching residues and comprises a double-chamber liquid processing system. The double-chamber liquid processing system will be explained below.

Figure 9:
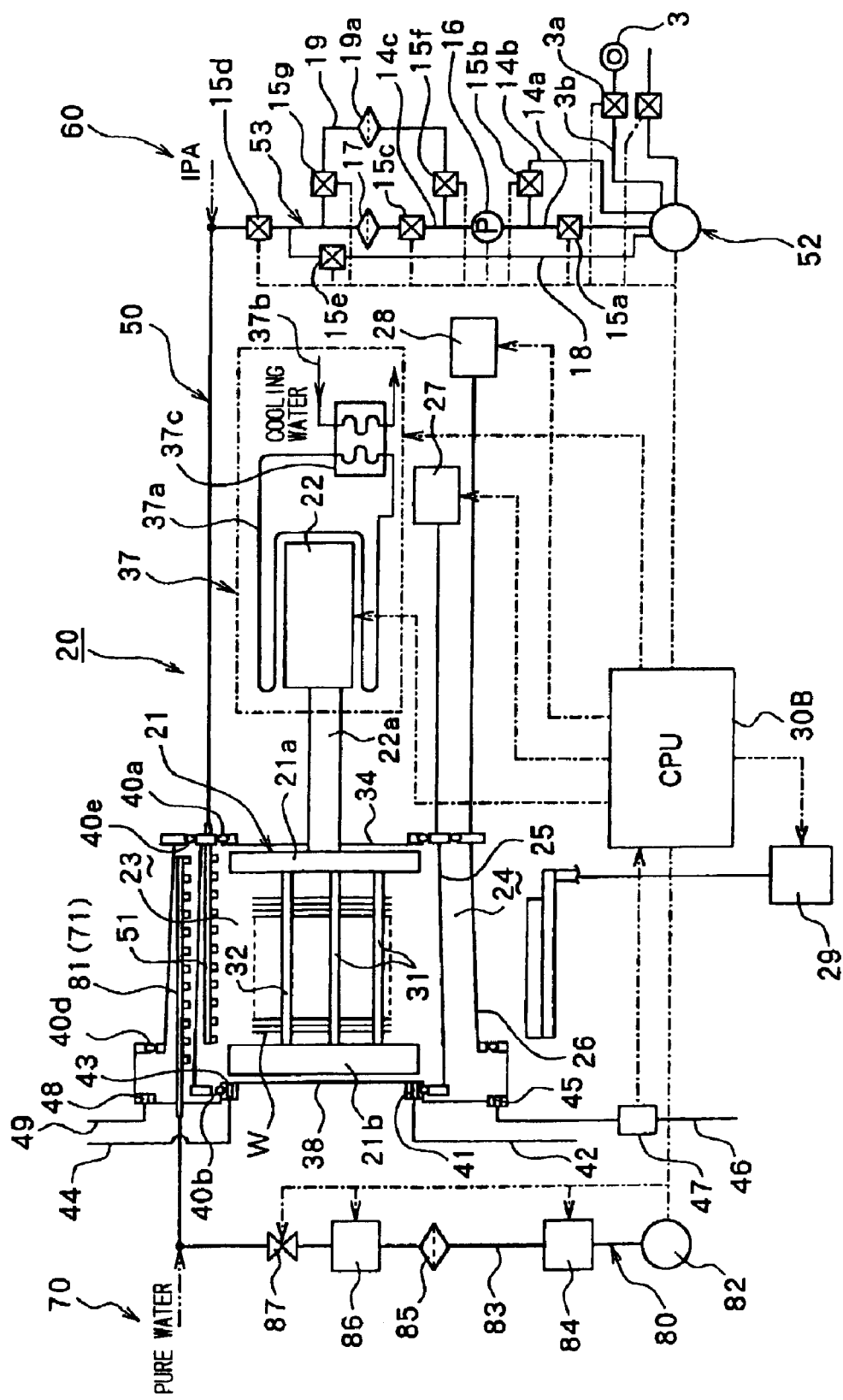
FIG. 9 is a block diagram of the double-chamber liquid processing system shown in FIG. 8.

A shown in FIG. 9, the double chamber processing means 20 mainly comprises rotary holding means, e.g., a rotor 21 for holding wafers W, objects to be processed; drive means for rotating the rotor 21 on the horizontal axis, e.g., a motor 22; a plurality, e.g., two processing units, e.g., an inner chamber 23 and an outer chamber 24 [specifically of a first processing chamber and a second processing chamber] for enclosing the wafers W held by the rotor 21; supply means 50 for feeding a processing liquid, e.g., a resist stripper, a polymer remover or others, to the wafers W loaded in the inner chamber 23 or the outer chamber 24; supply means 60 for feeding a solvent, e.g., isopropyl alcohol (IPA) for the chemical liquid; liquid supply means (rinse liquid supply means) 70 for supplying a rinse liquid, e.g., pure water or others, or supply means 80 for supplying an inert gas, e.g., nitrogen ($N_2$) or others or drying gas (drying fluid), such as clean air or others [corresponding to chemical liquid supply means 50 and drying fluid supply means 80 in FIG. 9], moving means, e.g., a first and a second cylinders 27, 28 for moving the inner cylinder 25 forming the inner chamber 23 and the outer cylinder 26 forming the outer chamber 24 to a position for enclosing the wafers W or a position apart from the wafers W enclosing position, and objects-to-be-processed transfer means, e.g., a wafers transfer hand 29 for receiving the wafers W from a wafer carrying chuck (not shown) to transfer the wafers to the rotor 21 and receiving the wafers W from the wafer carrying chuck to transfer the wafers to the rotor 21.

The motor 22, the supply members, e.g., the respective supply means 50, 60, 70, 80 for processing fluids [corresponding to the chemical liquid supply means 50 and the drying fluid supply means 80 in FIG. 9], the wafers moving mechanism 250, etc. of the liquid processing system 20 having the above-described constitution are controlled by control means, e.g., a central processing unit 30B (hereinafter called a CPU 30B).

The rotor 21 is cantilevered by the drive shaft 22a of the motor 22 arranged horizontal and holds the wafers W with the surfaces-to-be-processed arranged vertically and is rotatable on the horizontal axis. The rotor 21 comprises a first rotary plate 21a having a rotary shaft (not shown) connected to the drive shaft 22a via a coupling (not shown), a second rotary plate 21b opposed to the first rotary plate 21a, a plurality of, e.g., 4, fixed holding rods 31 disposed between the first and the second rotary plates 21a, 21b, and a pair of presser rods 32 which is moved to a pressing position and a non-pressing position by locking means and unlocking means not shown for pressing the tops of the wafers W held in the holding grooves (not shown) provided side by side in the fixed holding rods 31. The motor 22 is controlled by a program stored in advance in the CPU 30B to selectively repeat a prescribed high-speed rotation and a low-speed rotation. The motor 22 is cooled by cooling means 37 not to overheat. The cooling means 37 comprises a cooling pipe 37a, a cooling water supply pipe 37b and a heat exchanger 37c (see FIG. 9).

The processing unit, e.g., the inner chamber 23 (the first processing chamber) comprises a first fixed wall 34, a second fixed wall 38 opposed to the first fixed wall 34, an inner cylindrical body 25 engaged between the first fixed wall 34 and the second fixed wall 38 respectively by a first and a second seal members 40a, 40b. That is, the inner cylindrical body 25 is moved together with the rotor 21 by the extending operation of the first cylinder 27 as the moving means to a position where the inner cylindrical body 25 encloses the wafers W to define the inner chamber 3 (the first processing chamber), sealed with respect to the first fixed wall 34 by the first seal member 40a and with respect to the second fixed wall 38 by the second seal member 40b. The inner cylindrical body 25 is moved by the withdrawing operation of the first cylinder 27 to a position (stand-by position) outside the outer periphery of a fixed cylindrical body 36. In this state, the forward opening of the inner cylindrical body 25 is sealed with respect to the first fixed wall 34 by the first seal member 40a, and the proximal portion of the inner cylindrical body 25 is sealed by a third seal member 40c circumferentially provided in the fixed cylindrical body 36 at the middle thereof, for the prevention of leakage of an atmosphere of the chemical liquid remaining in the inner chamber 23 to the outside.

The outer chamber 24 (the second processing chamber) comprises the first fixed wall 34 having the seal member 40b with respect to the inner cylindrical body 25 moved to the stand-by position, the second fixed wall 38, and an outer cylindrical body 26 which is to be engaged between the second fixed wall 38 and the inner cylindrical body 25 respectively with a fourth seal member 40d and a fifth seal member 40e therebetween. That is, the outer cylindrical body 26 is moved together with the rotor 21 by the extension operation of the second cylinder 28 as moving means to a position where the outer cylindrical body 26 encloses the wafers W, sealed with respect to the second fixed wall 38 by the fourth seal member 40d to thereby define the outer chamber 24 (the second processing chamber). The outer cylindrical body 26 is moved to a position (stand-by position) outside the outer periphery of the fixed cylindrical body 36 by the withdrawing operation of the second cylinder 28. In this state, a fifth seal member 40e is present between the outer cylindrical body 26 and the proximal end of the inner cylindrical body 25 for the sealing. Accordingly, an internal atmosphere of the inner chamber 23 and an internal atmosphere of the outer chamber 24 are gas- and water-tightly isolated from each other without mixing with each other, whereby the cross-contamination caused by reactions between different processing fluids can be prevented.

Both the inner cylindrical body 25 and the outer cylindrical body 26 having the above-described structures are tapered increasingly forward. The inner cylindrical body 25 and the outer cylindrical body 26 are thus tapered increasingly to one ends, whereby streams generated when the rotor 21 is rotated in the inner cylindrical body 25 or the outer cylindrical body 26 helically flows to the side of the increasingly tapered ends, which facilitates the discharge of the interior chemical liquids, etc. toward the increasingly tapered side. The inner cylindrical body 25, the outer cylindrical body 26 are overlapped on the same axial line, whereby a space the inner cylindrical body 25 and the outer cylindrical body 26, and the inner chamber 23 and the outer chamber 24 take can be small, and the system can be smaller-sized.

Figure 10:
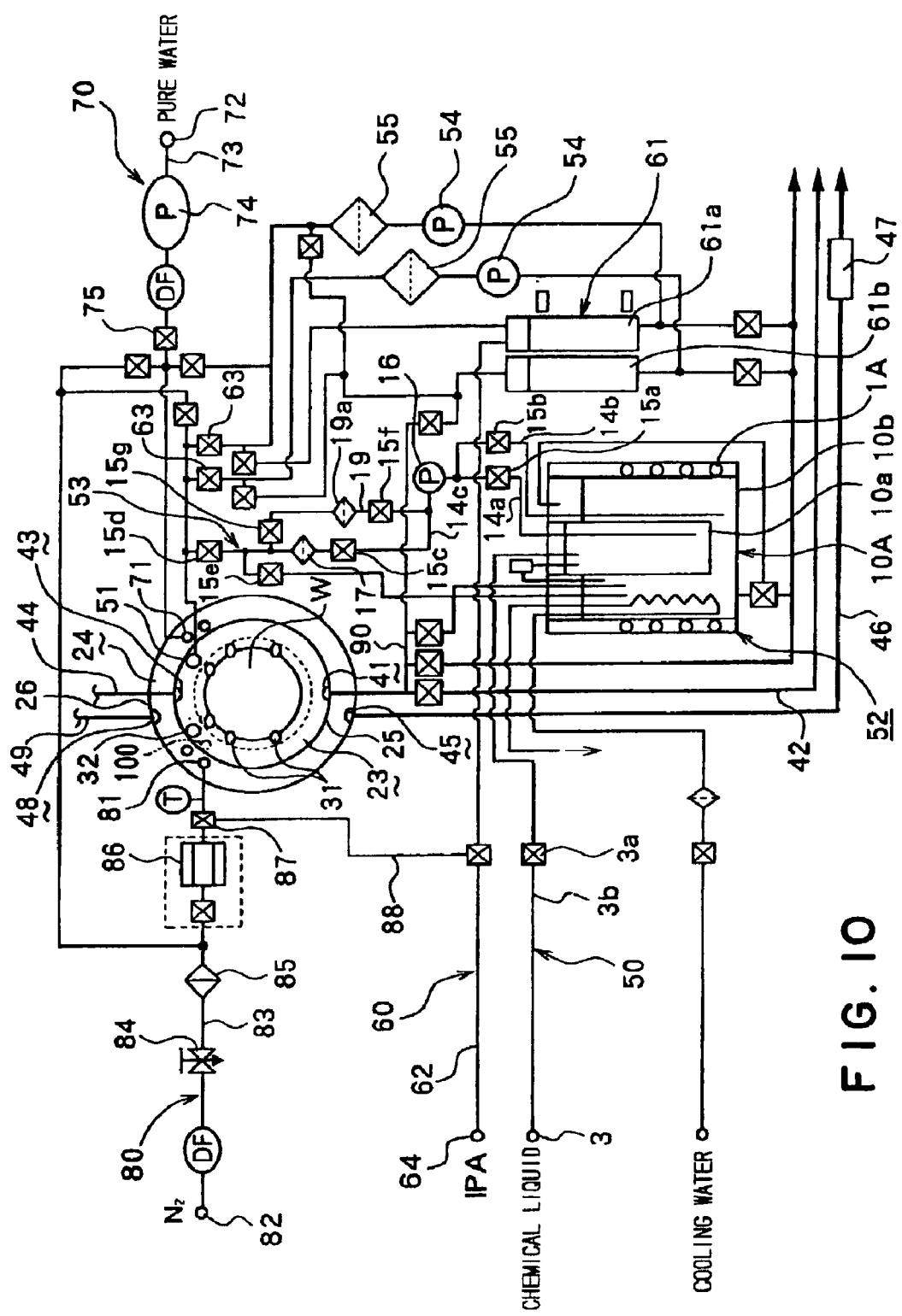
FIG. 10 is diagrammatic view of piping systems of the processing liquid of the double-chamber liquid processing system.

The chemical supply means 50 for supplying a chemical liquid, e.g., a polymer remover, of the above-described processing liquid supply means comprises, as shown in FIG. 10, a chemical liquid supply nozzle 51 (processing liquid supply means), a chemical liquid supply unit 52, and a chemical liquid supply pipe 53 connecting the chemical supply nozzle 51 to the chemical liquid supply unit 52.

Figure 11:
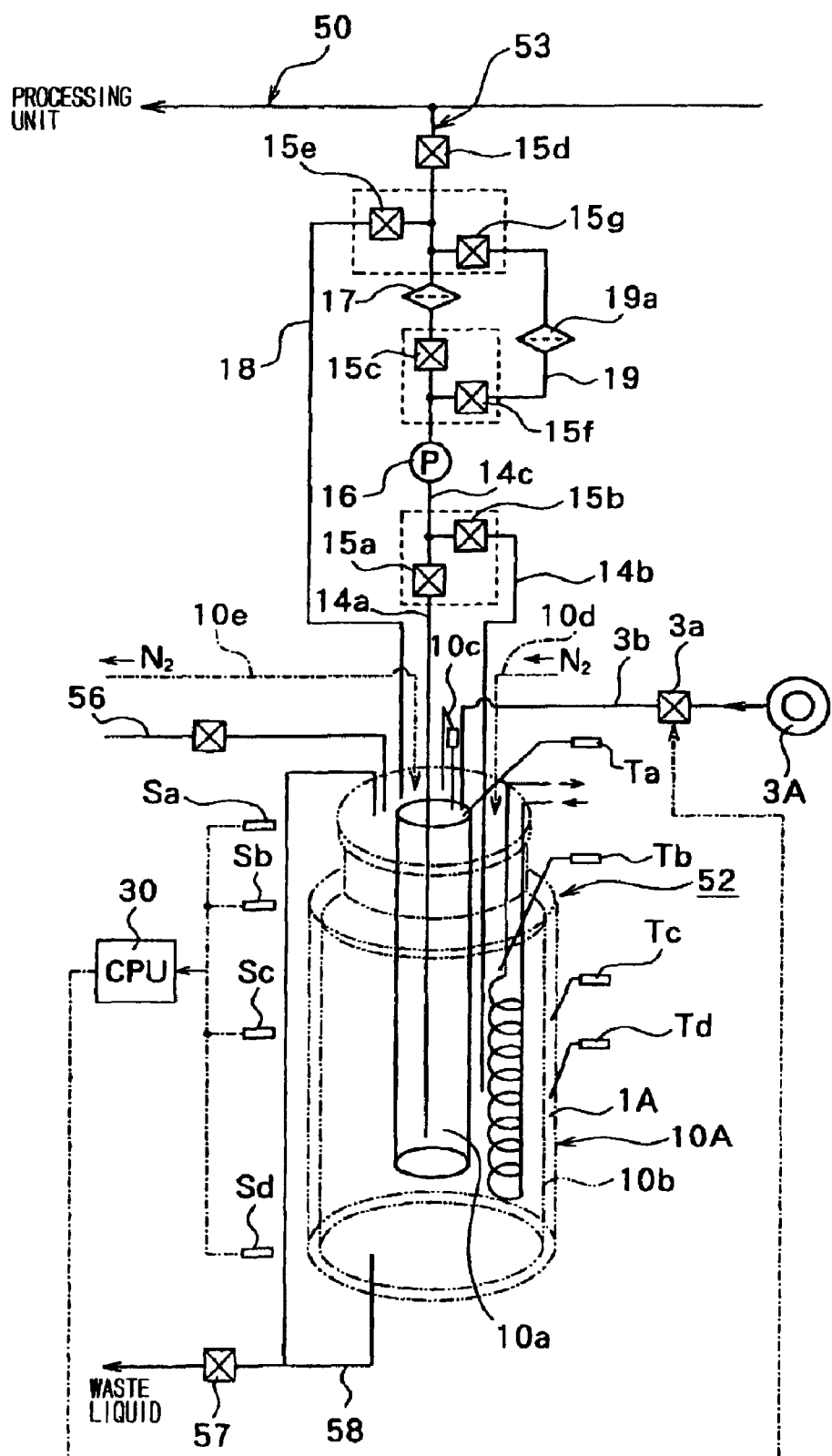
FIG. 11 is a block diagram of the chemical liquid supply unit of the double-chamber liquid processing system.

The chemical liquid supply unit 52 mainly comprises, as shown in FIG. 11, a chemical liquid supply source 3A, and a tank 10 for storing the fresh chemical liquid supplied from the chemical liquid supply source 3A and storing the chemical liquid which has been used in the processing.

The tank 10 has the double structure comprising an inner tank 10a for storing the fresh chemical liquid, which is connected to the chemical liquid supply source 3A through a chemical liquid pipe 3b with a chemical liquid opening/closing valve 3a, and an outer tank 10b containing the inner tank 1a inside. The inner tank 10a and the outer tank 10b respectively comprise stainless cylindrical containers having the bottoms. A heater 1A is disposed around the outer circumferential surface of the outer tank 10b, surrounding the outer tank 10b.

Figure 12:
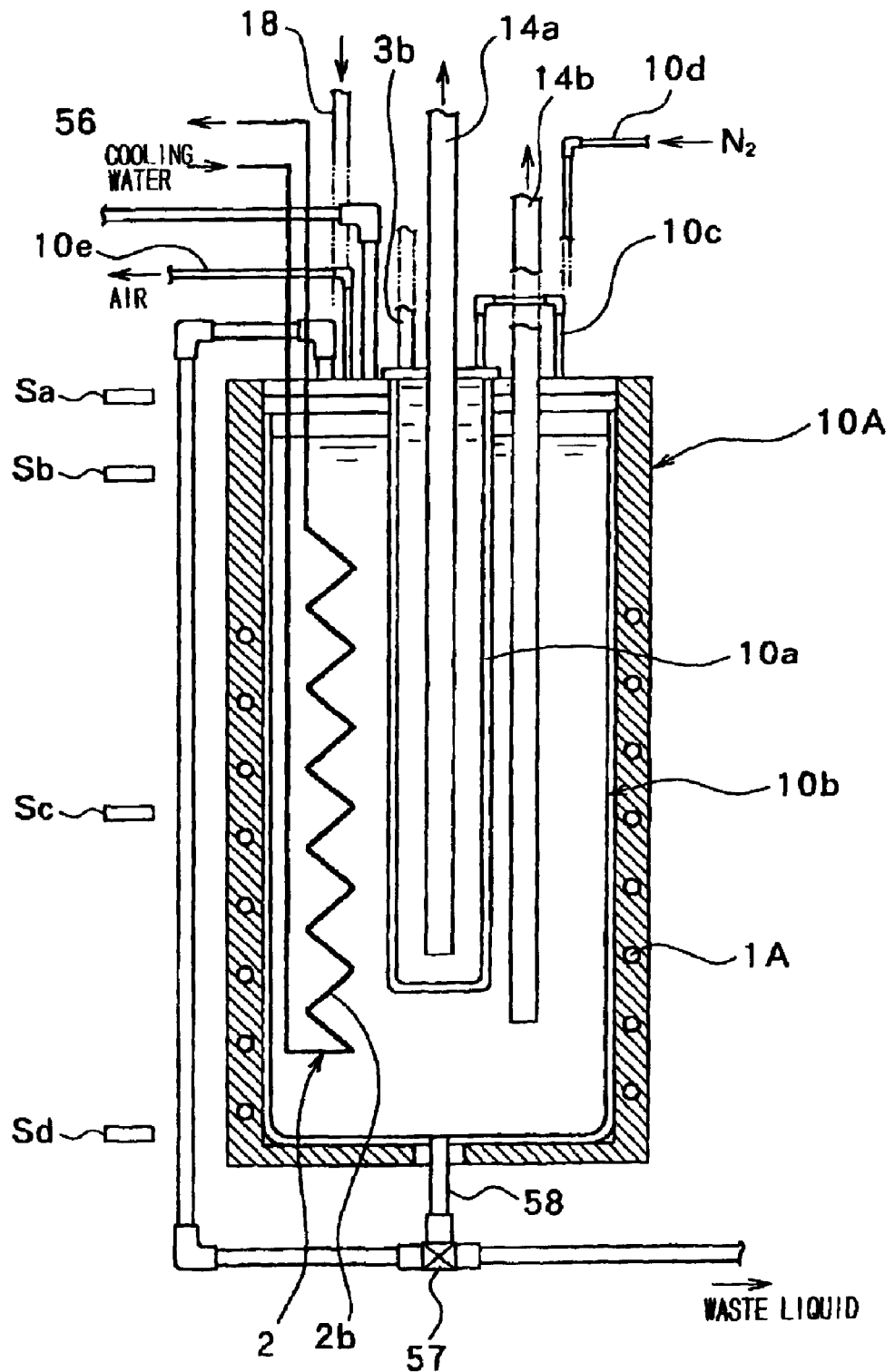
FIG. 12 is a sectional view of a tank of the double-chamber liquid processing system.
Figure 13:
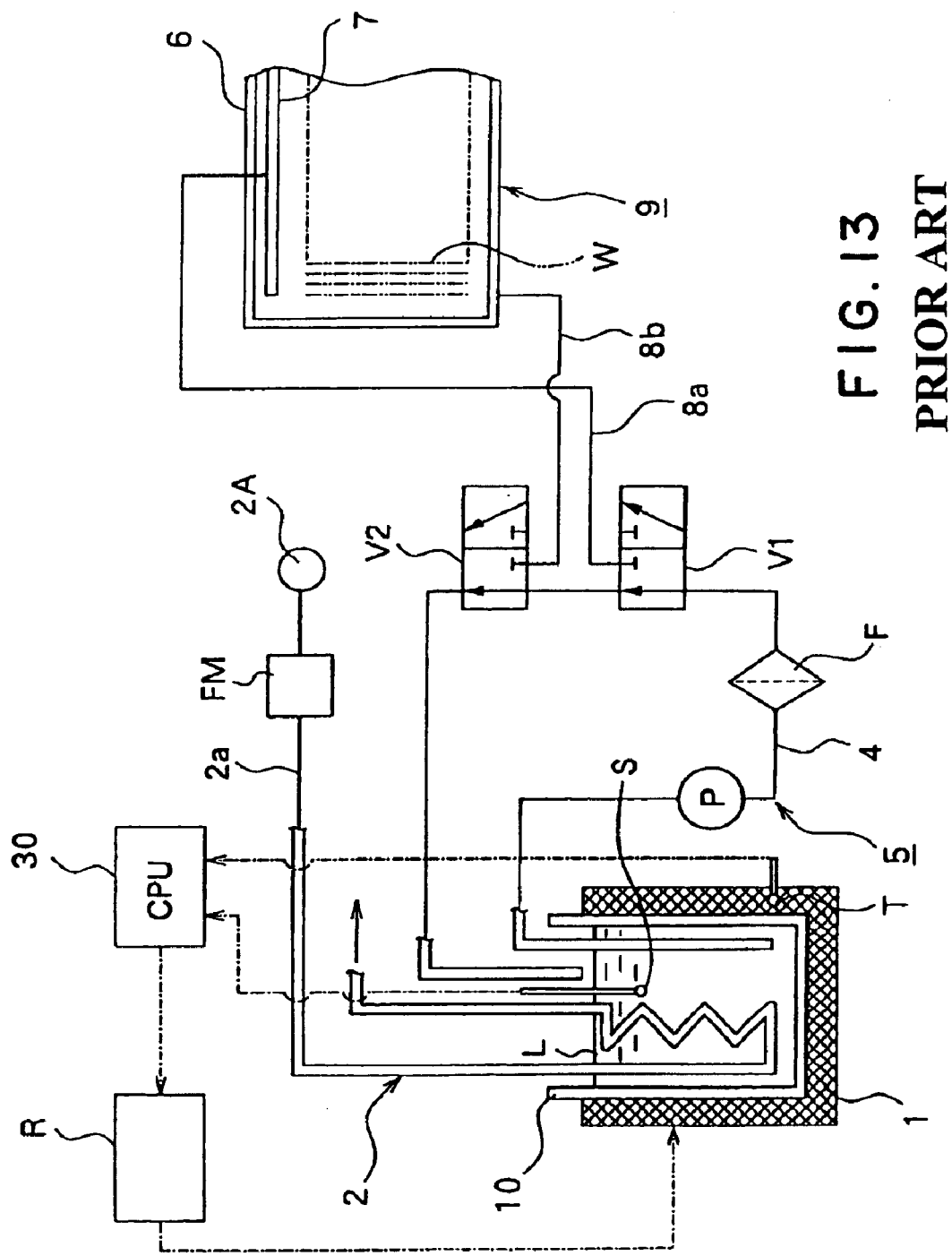
FIG. 13 is a block diagram of the conventional liquid processing system.

An overflow pipe 10c is disposed on the tope of the inner tank 10a, for supplying the chemical liquid overflowing the inner tank 10a into the outer tank 10b (see FIG. 12). Accordingly, the fresh chemical liquid supplied into the inner tank 10a from the chemical liquid supply source 3A fills the inner tank 10a and flows into the outer tank 10b through the overflow pipe 10c. It is preferable that a gap between of the opening of the outer tank 10b with respect to the inner tank 10a is small. This is because as the gap between the inner tank 10a and the outer tank 10b is smaller, an area of the liquid surface of the chemical liquid stored in the outer tank 10b, which contacts the outside air can be smaller, whereby chemical reaction and deterioration of the chemical liquid due to the contact thereof with the air can be suppressed, and the quality and effectiveness of the chemical liquid can be maintained.

A purge gas supply pipe 10d and a gas release pipe 10e are connected to the opening between the inner tank 10a and the outer tank 10b, and a purge gas, e.g., $N_2$ gas is fed through the purge gas supply pipe 10d connected to a purge gas supply source e.g., $N_2$ gas or others supply source not shown, so that the chemical liquid stored in both the tanks 10a, 10b are prevented from being exposed to the outside air to thereby change an atmosphere. Near the outside of the outer tank 10b there are respectively provided an upper limit sensor Sa, a basis weight sensor Sb, a heater-off lower limit sensor Sc and a lower limit sensor Sd, which are of capacitance type. These sensors Sa–Sd are connected to the CPU 30B. The sensors Sa–Sd are not essentially of capacitance type and may be of other types as long as they can detect the liquid surface. Of these sensors Sa–Sd, the upper limit sensor Sa and the lower limit sensor Sd can detect an upper limit liquid surface and a lower limit liquid surface of the chemical liquid stored in the outer tank 10b. The basis weight sensor Sb can detect an amount of the chemical liquid actually stored in the outer tank 10b, and the heater-off lower limit sensor Sc can detect a chemical liquid amount which can be heated by the heater 4. A chemical liquid fullness sensor (not shown) is disposed on the upper end of the inner tank 10a, so that the chemical liquid fullness sensor can monitor a state of the chemical liquid overflowing the inner tank 10a into the outer tank 10b. That is, based on detected signals from the chemical liquid fullness sensor and the basis weight sensor Sb, the CPU 30B supplies control signals to the chemical liquid opening/closing valve 3a to thereby control liquid amounts of the chemical liquid in the inner tank 10a and the outer tank 10b.

The chemical liquid stored in the inner tank 10a and the chemical liquid stored in the outer tank 10b are heated and kept heated by the single heater 1A disposed near the outside of the outer tank 10b. A temperature of the chemical liquid in the inner tank 10a can be detected by an inner tank chemical liquid temperature sensor Ta, a temperature of the chemical liquid in the outer tank 10b can be detected by an outer tank chemical liquid temperature sensor Tb, and a temperature of the heater 1 can be detected by a control temperature sensor Tc and an overheat temperature sensor Td. Detected signals of the outer tank chemical temperature sensor Tb, the control temperature sensor Tc and the overheat temperature sensor Td of these temperature sensors Ta–Td are supplied to the CPU 30B, and based on control signals from the CPU 30B, a PID temperature controller (not shown) controls the chemical liquid temperature in the outer tank 10b and the heating temperature of the heater 1 to be prescribed temperatures (e.g., above 80° C. and below 150° C.).

The cooling portion 2b of the cooling means 2 is disposed inside the outer tank 10b, so that cooling water supplied from a cooling water supply source (not shown) flows through the cooling portion 2b to heat-exchange the chemical liquid in the outer tank 10b so as to cool the chemical liquid.

The chemical liquid supply pipe 53 connecting the chemical liquid supply unit 52 to the chemical supply nozzle 51 provided inside the processing unit, i.e., the inner cylindrical body 25 comprises, as shown in FIGS. 9 and 11, a first supply pipe 14a for supplying the chemical liquid in the inner tank 10a to the processing unit, a second supply pipe 14b for supplying the chemical liquid in the outer tank 10b to the processing unit, and a main supply pipe 14c commonly interconnecting the first and the second supply pipes 14a, 14b. A first change-over opening/closing valve 15a is inserted in the first supply pipe 14a, and a second change-over opening/closing valve 15b is inserted in the second supply pipe 14b. A diaphragm supply pump 16, for example, is inserted in the main supply pipe 14c, and a third change-over opening/closing valve 15c, a filter 17 and a fourth change-over opening/closing valve 15d are inserted in the supply pump on the discharge side in the stated order.

A circulation pipe 18 with a fifth change-over opening/closing valve 15e inserted in, which corresponds to the above-described stand-by circulation passage 4, is connected to the discharge side of the supply pump 16 of the main supply pipe 14c and the outer tank 10b, so that the chemical liquid supplied from the interior of the outer tank 10b can be circulated.

A bypass pipe 19 branched from the main supply pipe 14c and again connected to the main supply pipe 14c is interconnected between the discharge side of the supply pump 16 of the main supply pipe 14c [specifically between the supply pump 16 and the third change-over opening/closing valve 15c] and the connection between the discharge of the third change-over opening/closing valve 15c and the circulation pipe 18. A sixth change-over opening/closing valve 15f, a filter 19a and a seventh change-over opening/closing valve 15g are inserted in the bypass pipe 19 in the stated order. A return pipe 56 for the chemical liquid, which corresponds to the discharge passage 8b, is connected to the opening 2b of the outer tank 10b and the processing unit, so that the chemical liquid used in the processing unit for the processing is stored in the outer tank 10b to be recycled.

In the chemical liquid supply pipe 53 of the above-described arrangement, the chemical liquid stored in the outer tank 10b can be supplied to the processing unit through the second supply pipe 14b, the main supply pipe 14c, the bypass pipe 19 and the main supply pipe 14c. The chemical liquid (fresh chemical liquid) stored in the inner tank 10a can be supplied to the processing unit through the first supply pipe 14a and the main supply pipe 14c. While the wafers W are standing by for the processing, the chemical liquid stored in the outer tank 10b can be circulated through the circulation pipe 18. At this time, as described in the above-described second and the third embodiments, with the first and the second opening/closing valves Vb, Vc of the cooling means opened or with the flow rate control valve CV full-opened, the cooling water is contacted to the chemical liquid in the tank 10a, whereby a heating amount of the heater 1A is made larger than a processing heat amount to thereby control a temperature of the chemical liquid in the allowable processing temperature (monitor temperature range). In this case, the circulation of the chemical liquid is different from that of the above-described first to the third embodiments, and the chemical liquid is returned directly into the outer tank 10b without being passed from the wafer processing unit, i.e., the inner cylindrical body 25 through the stand-by circulation line.

A drain pipe 58 with a drain opening/closing valve 57 inserted in is connected to the bottom of the outer tank 10b (see FIGS. 11 and 12).

Supply means 60 for a solvent, e.g., IPA for the chemical liquid comprises, as shown in FIG. 10, a supply nozzle 51 functioning also as the above described chemical liquid supply nozzle provided inside the inner cylindrical body 25 (hereinafter represented by a chemical liquid supply nozzle 51); a solvent supply unit 61; a pump 54 inserted in the IPA supply pipe 62 connecting a chemical liquid supply unit 52 to the supply nozzle 51; a filter 55; and an IPA supply valve 63. the solvent supply unit 61 comprises a supply source 64 of a solvent, e.g., IPA, an IPA supply tank 61a for storing fresh IPA fed from the IPA supply source 64, and a circulation supply tank 61b for storing the IPA used for the processing. Both the IPA supply tanks 61a, 61b are connected to a circulation pipe 90 connected to a discharge pipe 42 connected via a change-over valve (change-over means) not shown to a first drain port 41 disposed at a lower part of the increasingly tapered side of the inner chamber 23. In the drawing, the IPA supply tanks 61a, 61b are separately shown, but it is preferable to provide the IPA supply tanks 61a, 61b in a double structure as is the inner tank 10a and the outer tank 10b.

As shown in FIG. 10, supply means 70 for the rinse liquid, e.g., pure water comprises a pure water supply nozzle 70 mounted on a second fixed wall 38; a pure water supply source 72; a supply pump 74 inserted in a pure water supply pipe 73 connecting the pure water supply source 72 to the pure water supply nozzle 71; and a pure water supply valve 75. The pure water supply nozzle 71 is outside the inner chamber 23 but inside the outer chamber 24, so that when the inner cylindrical body 25 has been withdrawn to the stand-by position, and the outer cylindrical body 26 is moved to the position where the outer cylindrical body 26 encloses the rotor 21 and the wafers W, defining the outer chamber 24, the pure water supply nozzle 71 is located inside the outer chamber 24 to supply the pure water to the wafers W. The pure water supply nozzle 71 may be mounted on the outer chamber 24.

A second drain port 45 is provided at a lower part of the increasingly tapered part of the outer chamber 24. The second drain port 45 is connected to a drain pipe 46 with an opening/closing valve not shown inserted in. A resistivity meter 47 which detects a resistivity value of the pure water is inserted in the second drain pipe 46. The resistivity meter 47 detects a resistivity value of the pure water used in the rinse processing, and a signal of the detected value is supplied to the CPU 30B. Thus, a rinse processing state is monitored by the resistivity meter 47 to complete the rinse processing when the rinse processing is proper.

A second exhaust port 48 is provided at an upper part of the increasingly tapered part of the outer chamber 24, and the second exhaust port 48 is connected to a second exhaust pipe 49 with an opening/closing valve not shown inserted in.

As shown in FIGS. 9 and 10, the drying fluid supply means 80 comprises a drying fluid supply nozzle 81 mounted on the second fixed wall 38; a drying fluid, e.g., nitrogen ($N_2$) gas supply source 82; an opening/closing valve 84 inserted in a drying fluid supply pipe 83 connected the $N_2$ source 82 to the drying fluid supply nozzle 81; a filter 85; and an $N_2$ temperature controller 86. The secondary side of the $N_2$ temperature controller 86 of the drying fluid supply pipe 83 is connected via an opening/closing valve 87 to a branch pipe 88 branched from the IPA supply pipe 62. As is the pure water supply nozzle 71, the drying fluid supply nozzle 81 is located outside the inner chamber 23 but inside the outer chamber 24, so that when the inner cylindrical body 25 is withdrawn to the stand-by position, and the outer cylindrical body 26 is moved to the position where the outer cylindrical body 26 encloses the rotor 21 and the wafers W, defining the outer chamber 24, the drying fluid supply nozzle 81 is located inside the outer chamber 24 and can atomize a mixed fluid of the $N_2$ gas and the IPA to the wafers W. In this case, after the drying is performed with the mixed fluid of the $N_2$ gas and the IPA, further drying is performed with $N_2$ gas alone. The drying fluid is here the mixed fluid of $N_2$ gas and the IPA, but $N_2$ gas alone may be supplied in place of the mixed fluid.

The chemical liquid supply means 50, the IPA supply means 60, the supply pumps 16, 54 of the pure water supply means 70 and the drying fluid supply means 80, the first to the seventh change-over opening/closing valves 15a–15g of the chemical liquid supply means 52, the temperature controller 56, the $N_2$ temperature controller 86, the IPA supply valve 63 and the change-over valve 87 are controlled by the CPU 30B (see FIG. 9).

Then, the operation of the cleaning/drying processing system having the above-described constitution will be explained.

A carrier 100 is carried by the carrier carrying mechanism 200 to the carrier stand-by unit 250 directly below the cleaning processing means 20 from the side of the container loading/unloading unit 110. Then, the wafer transferring mechanism 260 is lifted and pushes up a plurality of wafers W in the carrier 100 standing by in the carrier stand-by unit 250 to set the wafers W on the rotor 21.

When the wafers W are thus set on the rotor 21, the inner cylindrical body 25 and the outer cylindrical body 26 are moved to the position where they enclose the rotor 21 and the wafers W to load the wafers W in the inner chamber 23. First, the chemical liquid is supplied to the wafers W to subject the wafers W to the chemical liquid processing. In this chemical liquid processing, the chemical liquid is supplied for a prescribed period of time, e.g., tens minutes with the rotor 21 and the wafers W rotated at a small rotation number, e.g., 1–500 rpm, and then the supply of the chemical liquid is stopped. Then, the rotor 21 and the wafers W are rotated at a large rotation number, e.g., 100–3000 rpm for some seconds to scatter off the chemical liquid staying on the surfaces of the wafers W. The chemical liquid supply step and the chemical liquid scattering step are repeated several to thousands times to complete the chemical liquid processing.

In the chemical liquid processing step, in the normal processing with the inner tank 10a and the outer tank 10b filled with the chemical liquid, the chemical liquid to be first supplied is the chemical liquid stored in the outer tank 10b. That is, the supply pump 16 is operated with the second, the sixth, the seventh and the fourth change-over opening/closing vales 15b, 15f, 15g, 15d opened to supply the chemical liquid in the outer tank 10b to the processing unit through the second supply pipe 14b, the main supply pipe 14c and the bypass pipe 19. The chemical liquid which has passed through the bypass pipe 19 is filtrated by the filter 19a, and impurities, foreign objects, etc. mixed in the chemical liquid are removed. The chemical liquid which has been first used for a certain period of time is wasted through the first drain pipe 42. The rest chemical liquid is used for the processing for a certain period of time and then returned to the outer tank 10b to be circulated for the supply.

After the processing is performed with the chemical liquid being circulated and being supplied for a prescribed period of time, the fresh chemical liquid in the inner tank 10a is supplied to the side of the processing unit, and the chemical liquid processing is completed. When the fresh chemical liquid in the inner tank 10a is supplied to the processing unit, the second, the sixth and the seventh change-over opening/closing valves 15b, 15f, 15g are closed, and the first, the third and the fourth change-over opening/closing valves 15a, 15c, 15d are opened. In this state, the supply pump 16 is operated, whereby the fresh chemical liquid in the inner tank 10a is supplied to the processing unit through the first supply pipe 14a and the main supply pipe 14c. At this time, the fresh chemical liquid passing through the supply pump 16 is filtrated by the filter 17 to have impurities, foreign objects, etc. mixed in the chemical liquid removed. The fresh chemical liquid which has been supplied at the time of the previous processing and remained in the main supply pile 14c is filtrated together with the fresh chemical liquid for the next processing by the filter 17. The fresh chemical liquid which has been supplied for the processing is stored in the outer tank 10b through the return pipe 56. As described in the first to the third embodiments, the opening/closing valve Va of the cooling means 2 is opened, the first opening/closing valve Vb is opened, or the flow rate control valve CV is restricted to pass the cooling water to the cooling portion 2b of the cooling means 2, so as to cool the chemical liquid in the tank 10a in contact with the cooling water, whereby the abrupt change of the chemical liquid from the processing state of a large radiation to the stand-by state of a small radiation can be suppressed. Thus, a temperature of the chemical liquid can be in the allowable processing temperature range (70±1° C.) to be ready for the next stand-by circulation.

After the chemical liquid processing and the rinse processing have been completed, the inner cylindrical body 25 is withdrawn to the sand-by position, and the outer cylindrical body 26 encloses the rotor 21 and the wafers W, i.e., the wafers W are held in the outer chamber 24. Accordingly, even when the chemical liquid drops from the processed wafers W in the inner chamber 23, the drops of the chemical liquid can be received by the outer chamber 24. In this state, first, the rinse liquid, e.g., pure water is fed to the wafers W on rotation from the pure water supply nozzle 71 of the rinse liquid supply means, and the wafers Ware subjected to the rinse processing. The pure water fed to the rinse processing and the removed IPA are discharged through the second drain pipe 46 via the second drain port 45. Gas generated inside the outer chamber 24 is exhausted outside through the second exhaust pipe 49 via the second exhaust port 48.

After the rinse processing is thus performed for a prescribed period of time, with the wafers W loaded in the outer chamber 24 a mixed fluid of the $N_2$ gas and the IPA is fed to the wafers W on rotation from the $N_2$ gas supply source 82 of the drying fluid supply means 80 and the IPA supply source 64 to remove the pure water staying on the surfaces of the wafers W, whereby the wafers W and the inside of the outer chamber 24 can be dried. The $N_2$ gas alone is fed to the wafer W after the wafers W have been subjected to the drying processing with the mixed fluid of the $N_2$ gas and the IPA, whereby the drying of the wafers W and the outer chamber 24 can be performed more efficiently.

After the chemical liquid processing, the chemical liquid removing processing, the rinse processing and the drying processing of the wafers W have been completed, the outer cylindrical body 26 and the inner cylindrical body 25 are withdrawn to the stand-by position outside the outer circumference while the lock releasing means not shown is operated to withdraw the wafer presser rod 32 from the wafers W pressing position. Then, the wafer moving mechanism 260 is lifted to receive the wafers W held by the fixed holding rods 31 of the rotor 21 and; moved below the processing means 20. The wafers W which have been moved below the processing means 20 are loaded into a carrier 100 standing by in the carrier stand-by unit 250, then carried by the carrier carrying mechanism 200 to the container loading/unloading unit 100, and carried outside the system.

In the above-described embodiments, the liquid processing method and the liquid processing system according to the present invention are applied to the cleaning/drying processing system for semiconductor wafers but are applicable, needless to say, to the cleaning/drying processing systems for glass substrates for LCDs other than the semiconductor wafers. The liquid processing method and the liquid processing system according to the present invention are applicable to liquid processing systems using chemical liquids, etc. other than the cleaning/drying processing system.

In the above-described embodiments, the liquid processing method and the liquid processing system according to the present invention have been explained by the application using chemical liquids, but the present invention is applicable to cases using super-critical fluids.

What is claimed is:

1. A liquid processing method in which a processing liquid stored in a tank is heated and cooled by heaters and cooling means and is circulated for stand-by, the processing liquid in the stand-by circulation is fed to objects-to-be-processed loaded in a processing chamber to process the objects-to-be-processed, and the processing liquid fed to the objects-to-be-processed is returned into the tank, said method comprising:

in the stand-by circulation, concurrently heating and cooling the processing liquid before the start of a processing such that a heat amount discharged from the processing liquid by said cooling in the stand-by circulation is substantially equal to a heat amount discharged from the processing liquid during processing.

2. The liquid processing method according to claim 1, further comprising, in the stand-by circulation, concurrently heating and cooling the processing liquid after the completion of the processing to control the processing liquid to be at a processing temperature.

3. The liquid processing method according to claim 1, further comprising stopping said cooling, and heating the processing liquid during processing to control the processing liquid to be at a processing temperature.

4. The liquid processing method according to claim 3, wherein said stopping is simultaneous with a change-over from the stand-by circulation to processing.

5. The liquid processing method according to claim 2, wherein a heat amount discharged from the processing liquid by the cooling of said heating and cooling after the completion of the processing in the stand-by circulation is substantially equal to a heat amount discharged from the processing liquid during processing.

6. The liquid processing method according to claim 2, wherein the cooling of said step of heating and cooling after the completion of the processing is started simultaneously with a change-over to the stand-by circulation.

7. The liquid processing method according to claim 1, further comprising stopping said cooling, and heating the processing liquid during processing to control the processing liquid to be at a processing temperature; and in the stand-by circulation, concurrently heating and cooling the processing liquid after the completion of the processing to control the processing liquid to be at a processing temperature.

8. The liquid processing method according to claim 7, wherein said stopping is simultaneous with a change-over from the stand-by circulation to processing.

9. The liquid processing method according to claim 7, wherein that a heat amount discharged from the processing liquid by the cooling of said heating and cooling after the completion of the processing in the stand-by circulation is substantially equal to a heat amount discharged from the processing liquid during processing.

10. The liquid processing method according to claim 7, wherein the cooling of said step of heating and cooling after the completion of processing is simultaneous with a change-over to the stand-by circulation.

11. The liquid processing method according to claim 1, wherein said heating and cooling are performed before the start of a processing, such that immediately before processing a heat amount produced by the heaters and a heat amount absorbed by the cooling means are increased.

12. The liquid processing method according to claim 11, further comprising stopping said cooling simultaneously with a change-over from the stand-by circulation to processing.

13. The liquid processing method according to claim 11, further comprising starting cooling simultaneously with a change-over to the stand-by circulation after processing.

14. A liquid processing method in which a processing liquid is stored in a tank is heated and cooled by heaters and cooling means and is circulated for stand-by, the processing liquid in the stand-by circulation is fed to objects-to-be-processed loaded in a processing chamber to process the objects-to-be-processed, and the processing liquid fed to the objects-to-be-processed is returned into the tank, said method comprising:

in the stand-by circulation, concurrently heating and cooling the processing liquid, wherein, said heating and cooling are performed before the start of a processing, such that immediately before processing a heat amount produced by the heaters and a heat amount absorbed by the cooling means are increased, and wherein, when the heat amount produced by the heaters and the heat amount absorbed by the cooling means are increased immediately before processing, a heat amount discharged from the processing liquid by the cooling is substantially equal to a heat amount discharged from the processing liquid during processing.

* * * * *